(12) United States Patent
Totsuka

(10) Patent No.: US 11,405,570 B2
(45) Date of Patent: Aug. 2, 2022

(54) IMAGING DEVICE, IMAGING SYSTEM, AND SEMICONDUCTOR CHIP

(71) Applicant: CANON KABUSHIKI KAISHA, Tokyo (JP)

(72) Inventor: Hirofumi Totsuka, Fujisawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/890,280

(22) Filed: Jun. 2, 2020

(65) Prior Publication Data

US 2020/0389617 A1  Dec. 10, 2020

(30) Foreign Application Priority Data

Jun. 10, 2019  (JP) ............................ JP2019-107924

(51) Int. Cl.
| | |
|---|---|
| *H04N 5/3745* | (2011.01) |
| *H01L 27/146* | (2006.01) |
| *H04N 5/378* | (2011.01) |
| *H04N 5/369* | (2011.01) |

(52) U.S. Cl.
CPC ... *H04N 5/37455* (2013.01); *H01L 27/14609* (2013.01); *H04N 5/378* (2013.01); *H04N 5/37457* (2013.01)

(58) Field of Classification Search
CPC ........................... H04N 5/37455; H04N 5/378
See application file for complete search history.

(56) References Cited

U.S. PATENT DOCUMENTS

| | | |
|---|---|---|
| 7,633,540 B2 | 12/2009 | Totsuka |
| 7,990,440 B2 | 8/2011 | Kobayashi |
| 8,084,729 B2 | 12/2011 | Kato |
| 8,154,639 B2 | 4/2012 | Kato |
| 8,189,081 B2 | 5/2012 | Totsuka |
| 8,309,898 B2 | 11/2012 | Kato |
| 8,411,185 B2 | 4/2013 | Totsuka |
| 8,553,118 B2 | 10/2013 | Saito |
| 8,605,182 B2 | 12/2013 | Totsuka |
| 8,937,672 B2 | 1/2015 | Totsuka |
| 9,013,765 B2 | 4/2015 | Totsuka |

(Continued)

FOREIGN PATENT DOCUMENTS

JP         2009-124514         6/2009

*Primary Examiner* — Christopher K Peterson
(74) *Attorney, Agent, or Firm* — Venable LLP

(57) ABSTRACT

According to one disclosure, a first semiconductor chip in which a plurality of pixels are formed and a second semiconductor chip stacked on the first semiconductor chip and including analog-to-digital conversion units are provided. A comparator includes a differential amplifier circuit that outputs a first signal, a source ground circuit that includes an input transistor to which the first signal is input and a load transistor cascade-connected to the input transistor and outputs a second signal from a connection node of the input transistor and the load transistor, and a current compensation circuit that includes a current control transistor to which the second signal is input and a current source transistor cascade-connected to the current control transistor and in which the current control transistor causes a second current to flow that changes complementarily with respect to a change of a first current flowing in the source ground circuit.

31 Claims, 16 Drawing Sheets

(56) References Cited

U.S. PATENT DOCUMENTS

| | | |
|---|---|---|
| 9,282,263 B2 | 3/2016 | Totsuka |
| 9,332,202 B2 | 5/2016 | Totsuka |
| 9,337,222 B2 | 5/2016 | Saito |
| 9,350,958 B2 | 5/2016 | Totsuka |
| 9,716,849 B2 | 7/2017 | Kobayashi |
| 9,787,932 B2 | 10/2017 | Totsuka |
| 9,838,633 B2 | 12/2017 | Muto |
| 9,876,975 B2 | 1/2018 | Yoshida |
| 10,003,761 B2 | 6/2018 | Totsuka |
| 10,057,519 B2 | 8/2018 | Kobayashi |
| 10,321,087 B2 | 6/2019 | Yoshida |
| 10,382,707 B2 | 8/2019 | Totsuka |
| 10,462,400 B2 | 10/2019 | Kobayashi |
| 10,594,971 B2 | 3/2020 | Totsuka |
| 2009/0128676 A1* | 5/2009 | Tanaka .................. H04N 5/2253 348/300 |
| 2018/0109750 A1* | 4/2018 | Sukegawa ......... H01L 27/14645 |
| 2019/0058842 A1 | 2/2019 | Totsuka |
| 2019/0104264 A1 | 4/2019 | Totsuka |
| 2019/0335127 A1* | 10/2019 | Kawasaki .......... H04N 5/37455 |
| 2020/0021760 A1 | 1/2020 | Kobayashi |
| 2020/0194472 A1 | 6/2020 | Inoue |

\* cited by examiner

IMAGING DEVICE, IMAGING SYSTEM, AND SEMICONDUCTOR CHIP

BACKGROUND OF THE INVENTION

Field of the Invention

The present invention relates to an imaging device, an imaging system, and a semiconductor chip.

Description of the Related Art

Conventionally, imaging devices having an analog-to-digital conversion unit have been used. An imaging device disclosed in Japanese Patent Application Laid-Open No. 2009-124514 includes an analog-to-digital conversion unit having a comparator that compares a signal of a photoelectric conversion unit with a reference voltage signal and a source ground circuit connected to the comparator. The imaging device disclosed in Japanese Patent Application Laid-Open No. 2009-124514 further has a current compensation circuit that compensates current fluctuations in the comparator and intends to avoid image quality deterioration due to the power source fluctuations.

In recent years, an imaging device in which a plurality of semiconductor chips are stacked has been proposed. In an imaging device with the stacked structure, since a constraint for the chip area is relatively small, it is possible to increase the number of pixels and analog-to-digital conversion units. In Japanese Patent Application Laid-Open No. 2009-124514, however, there is no suggestion for the configuration and arrangement of the analog-to-digital conversion units in the imaging device with the stacked structure.

The present invention intends to provide a technique for the configuration and arrangement of the analog-to-digital conversion units in an imaging device with stacked structure.

SUMMARY OF THE INVENTION

An imaging device in the disclosure of the present specification includes: a first semiconductor chip in which a plurality of pixels that generate pixel signals are formed; and a second semiconductor chip stacked on the first semiconductor chip and including a plurality of analog-to-digital conversion units that convert analog signals output from the pixels into digital signals. The plurality of analog-to-digital conversion units include comparators, respectively, and each of the comparators compares each of the analog signals with a reference signal, and each of the comparators includes a differential amplifier circuit including an output node that outputs a first signal based on a difference between each of the analog signals and the reference signal, a source ground circuit that includes an input transistor including a gate configured to receive the first signal from the output node of the differential amplifier circuit and a load transistor cascade-connected to the input transistor and outputs a second signal from a connection node of the input transistor and the load transistor, and a current compensation circuit that includes a current control transistor including a gate configured to receive the second signal from the connection node and a current source transistor cascade-connected to the current control transistor and causes a second current to flow that changes complementarily with respect to a change of a first current flowing in the source ground circuit.

An imaging device in another disclosure of the present specification is an imaging device including analog-to-digital conversion units that convert, into digital signals, analog signals output via signal lines from a plurality of pixels that generate pixel signals. Each of the analog-to-digital conversion units includes a comparator that compares each of the analog signals with a reference signal, and the comparator includes a differential amplifier circuit that outputs a first signal based on a difference between each of the analog signals and the reference signal, a source ground circuit that includes a first transistor of a first polarity connected to a first power source, in which the first signal is input to the first transistor, and a second transistor of a second polarity connected to a second power source and outputs a second signal inverted from the first signal from a connection node of the first transistor and the second transistor, and a current compensation circuit that includes a third transistor of the first polarity connected to the first power source, a fourth transistor of the second polarity connected to the second power source, and a fifth transistor of the first polarity provided between the third transistor and the fourth transistor, wherein the second signal is input to the fifth transistor, and the fifth transistor causes a second current to flow that changes complementarily with respect to a change of a first current flowing in the source ground circuit. At least any one of a first group of elements in which the first transistor and the third transistor are arranged adjacent to each other and a second group of elements in which the second transistor and the fourth transistor are arranged adjacent to each other is formed.

A semiconductor chip in another disclosure of the present specification is a semiconductor chip to be stacked including: a connection portion used for connecting to another semiconductor chip in which a plurality of pixels each including a photoelectric conversion unit are formed; and analog-to-digital conversion units that convert analog signals output from the pixels via signal lines into digital signals. Each of the analog-to-digital conversion units includes a comparator that compares each of the analog signals with a reference signal, and the comparator includes a differential amplifier circuit including an output node that outputs a first signal based on a difference between each of the analog signals and the reference signal, a source ground circuit that includes an input transistor including a gate configured to receive the first signal from the output node of the differential amplifier circuit and a load transistor cascade-connected to the input transistor and outputs a second signal from a connection node of the input transistor and the load transistor, and a current compensation circuit that includes a current control transistor including a gate configured to receive the second signal from the connection node and a current source transistor cascade-connected to the current control transistor, in which the current control transistor causes a second current to flow that changes complementarily with respect to a change of a first current flowing in the source ground circuit.

Further features of the present invention will become apparent from the following description of exemplary embodiments with reference to the attached drawings.

DESCRIPTION OF THE EMBODIMENTS

Embodiments of the present invention will be described below with reference to the drawings. The present invention is not limited to the embodiments described below. For example, a configuration of a part of any of the following embodiments may be added to another embodiment or replaced with a configuration of a part of another embodiment.

First Embodiment

Figure 1:
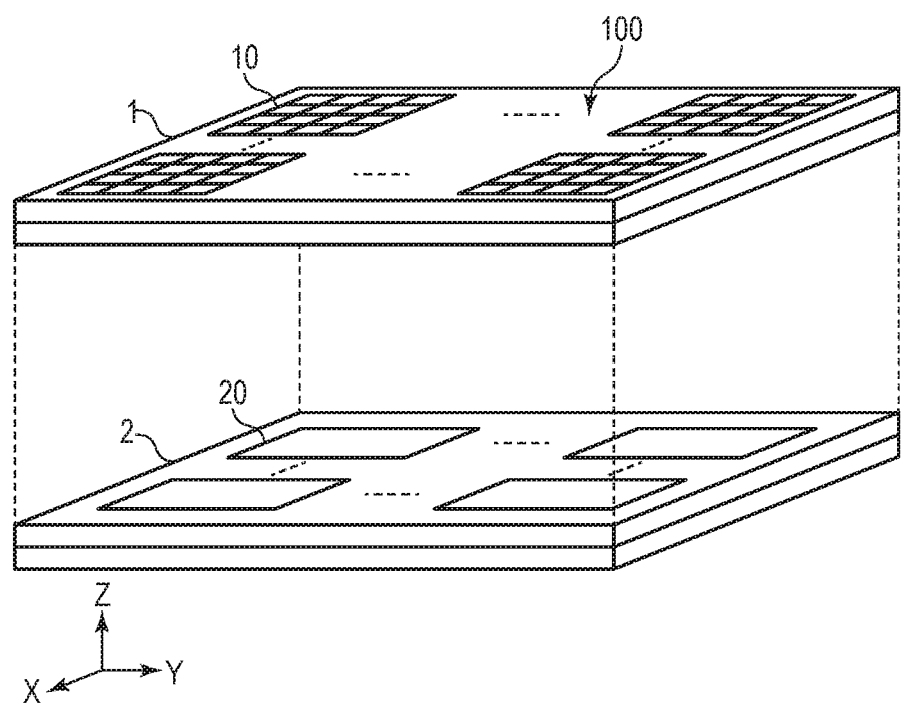
FIG. 1 is a schematic diagram of an imaging device of a first embodiment.

FIG. 1 is a schematic diagram of an imaging device of the present embodiment. The imaging device may be, for example, a complementary metal oxide semiconductor (CMOS) image sensor. The imaging device of the present embodiment is a so-called backside irradiation type and has a first semiconductor chip 1 and a second semiconductor chip 2 to be stacked.

A pixel unit 100 including a plurality of pixels 10 arranged in a matrix is formed in the first semiconductor chip 1. The pixels 10 are arranged in an array over a plurality of rows and a plurality of columns, that is, in the X direction and the Y direction. Each pixel 10 has a photoelectric conversion unit that generates and accumulates signal charges in accordance with a received light amount. Micro-lenses and color filters may be arranged on the pixels 10. The color filters are primary-color filters of red, blue, and green, for example, and provided for each pixel 10 in accordance with the Bayer arrangement. Some of the pixels 10 are shielded from light as optical black pixels (OB pixels). In the plurality of pixels 10, a ranging row in which focus detection pixels that output pixel signals used for focus detection are arranged and a plurality of imaging rows in which imaging pixels that output pixel signals used for generating an image are arranged may be provided. Furthermore, control lines used for driving the pixels 10 and signal lines used for reading out signals from the pixels 10 are arranged in the first semiconductor chip 1.

The second semiconductor chip 2 is stacked on the first semiconductor chip 1. A plurality of analog-to-digital conversion units (AD conversion unit) 20 are arranged in an array over a plurality of rows and a plurality of columns in the second semiconductor chip 2. Each AD conversion unit 20 is electrically connected to the pixel 10 via a signal line and digitally converts a signal read out from the pixel 10 into a multibit digital signal. Further, in addition to the AD conversion units 20, a vertical scanning circuit, a timing generation circuit, a signal processing circuit, or the like are provided in the second semiconductor chip 2. At least some of the plurality of AD conversion units 20 may be arranged so as to overlap the plurality of pixels 10 in plan view in the Z direction.

Figure 2:
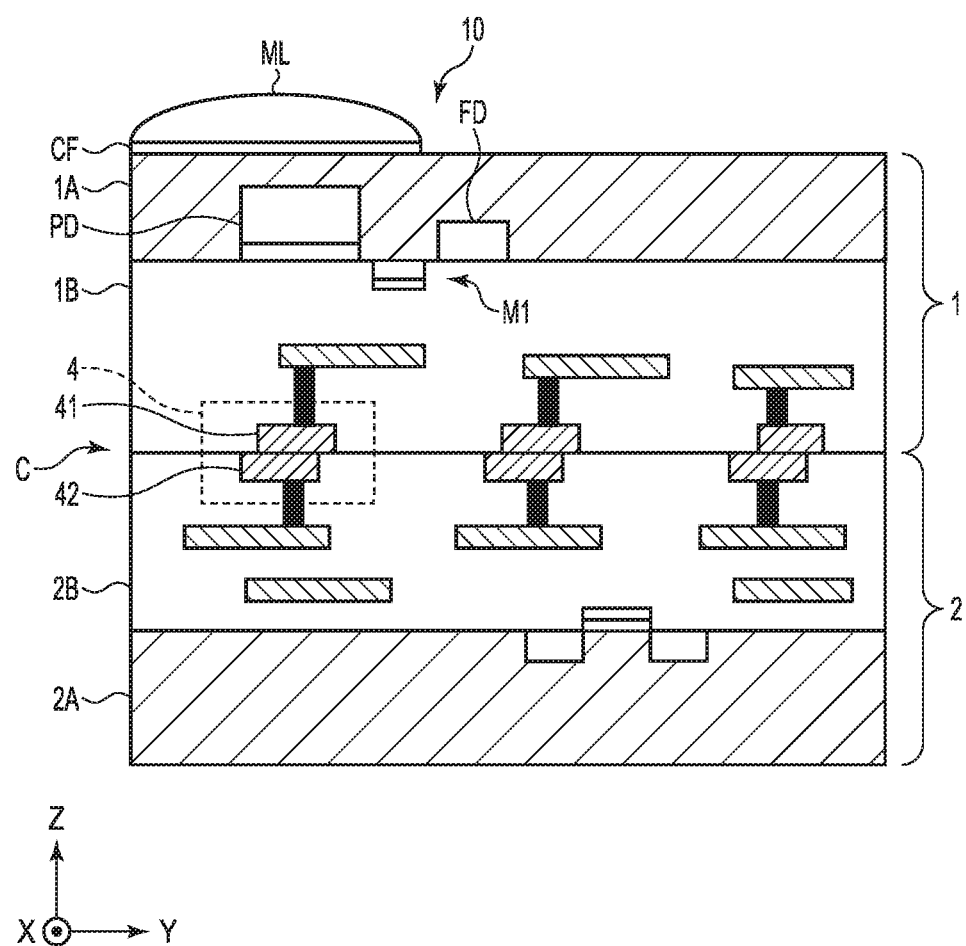
FIG. 2 is a partial sectional view of the imaging device of the first embodiment.

FIG. 2 is a partial sectional view of the imaging device of the present embodiment. The first semiconductor chip 1 includes a first semiconductor substrate 1A and a first wiring layer region 1B, and the second semiconductor chip 2 includes a second semiconductor substrate 2A and a second wiring layer region 2B. Respective first primary faces of the first semiconductor chip 1 and the second semiconductor chip 2, that is, the front side of the first wiring layer region 1B and the front side of the second wiring layer region 2B face each other to form a junction interface C. The second primary face (backside) of the first semiconductor substrate 1A is irradiated with incident light.

The first semiconductor substrate 1A is an N-type or P-type silicon substrate, and the pixels 10 are formed in the first semiconductor substrate 1A. FIG. 2 illustrates a photoelectric conversion unit PD, a floating diffusion region FD, a transfer transistor M1, a color filter CF, and a micro-lens ML of the pixel 10. The photoelectric conversion unit PD includes an N-type region surrounded by a P-type well, and a P-type region is provided on the upper part of the N-type region (in the −Z direction). With such a configuration, noise due to charges occurring at the boundary surface can be reduced. The color filter CF and the micro-lens ML are provided on the second primary face (backside) of the first semiconductor substrate 1A. The light that has entered the backside of the second semiconductor substrate 2A enters the photoelectric conversion unit PD via the micro-lens ML and the color filter CF. In such a way, the imaging device is configured to receive incident light from the backside of the second semiconductor substrate 2A, and the light receiving area can be increased to realize a high sensitivity imaging device.

The floating diffusion region FD includes an N-type region and forms a predetermined capacitance. The gate electrode of the transfer transistor M1 is arranged between the photoelectric conversion unit PD and the floating diffusion region FD and formed in the first semiconductor substrate 1A via a gate insulating film. The gate electrode is formed of a polysilicon electrode or a metal electrode of Al, Cu, or the like, for example, and the gate insulating film is made of $SiO_2$ or the like, for example. The source/drain regions of the transfer transistor M1 share the photoelectric conversion unit PD and the floating diffusion region FD. In response to a voltage being applied to the gate electrode of the transfer transistor M1, charges accumulated in photoelectric conversion unit PD are transferred to the floating diffusion region FD. The potential of the floating diffusion region FD changes in accordance with charges and is output via an amplifier transistor and a select transistor described later (see FIG. 3).

The first wiring layer region 1B is provided on the first semiconductor substrate 1A (in the −Z direction), and a plurality of wiring layers are formed via interlayer insulating films of an organic material or the like. Different wiring layers are connected to each other by connection portions extending in the Z direction, and each connection portion is further connected to a junction portion 4 of the first wiring layer region 1B. A signal output from the pixel 10 may be output to the second semiconductor chip 2 via the junction portion 4.

The second semiconductor substrate 2A is formed of an N-type or P-type silicon substrate in the same manner as the first semiconductor substrate 1A and may include a P-type well in which a P-type impurity is injected and an N-type well in which an N-type impurity is injected. A PMOS transistor (first polarity transistor) and an NMOS transistor (second polarity transistor) forming a drive circuit of the AD conversion unit 20 or the like are formed in the second semiconductor substrate 2A. The second wiring layer region 2B is provided on the second semiconductor substrate 2A (Z direction), and a plurality of wiring layers are formed via the interlayer insulating films of an organic material or the like. Different wiring layers are connected to each other by a connection portion extending in the Z direction, and the connection portion is further connected to a junction portion 4 of the upper part of the second wiring layer region 2B.

The junction portion 4 includes a contact electrode 41 formed on the front side of the first wiring layer region 1B and a contact electrode 42 formed on the front side of the second wiring layer region 2B. The contact electrode 41 and 42 may each be made of a metal such as Al, Cu, W, or the like. The first semiconductor chip 1 and the second semiconductor chip 2 are electrically connected via the junction portion 4.

Figure 3:
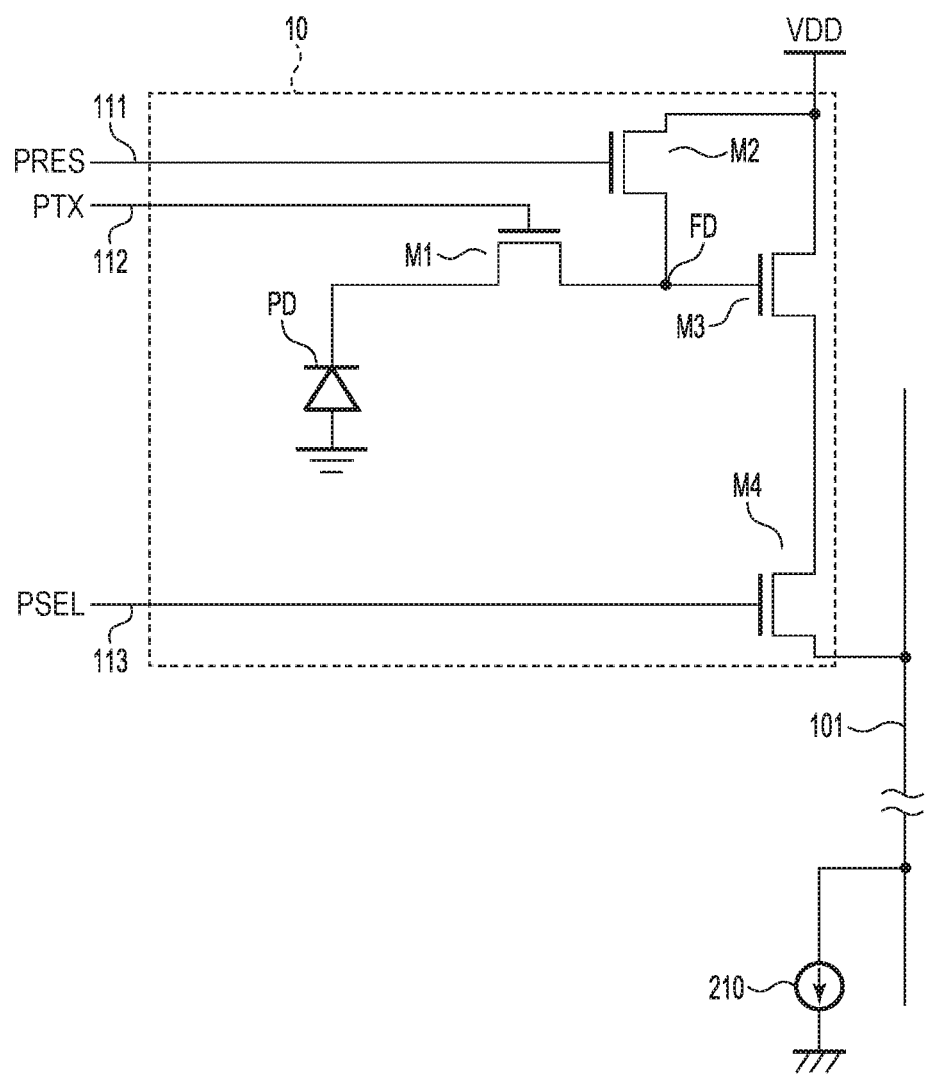
FIG. 3 is an equivalent circuit diagram of a pixel of the first embodiment.

FIG. 3 is an equivalent circuit diagram of the pixel 10 of the present embodiment. The pixel 10 includes the photoelectric conversion unit PD, the transfer transistor M1, the floating diffusion region FD, a reset transistor M2, an amplifier transistor M3, and a select transistor M4. In the following description, an example in which each transistor forming the pixel 10 is an N-channel MOS transistor will be described. The photoelectric conversion unit PD is formed of a photodiode, for example, and performs photoelectric conversion from incident light and accumulation of charges. Note that the photoelectric conversion unit PD is not limited to a photodiode and may be any material that generates photoelectric effect. The number of photoelectric conversion units PD for each pixel 10 is not limited, and two, four, or more photoelectric conversion units PD may be provided so as to share a single micro-lens. Furthermore, when an embedded type photodiode is formed, dark current noise can be reduced. The micro-lens is provided to the photoelectric conversion unit PD, and the light collected by the micro-lens enters the photoelectric conversion unit PD.

The transfer transistor M1 is provide in association with the photoelectric conversion unit PD, and a control signal PTX is applied to the gate via a signal line 112. When the control signal PTX is controlled to a high level, the transfer transistor M1 is in an on-state (conductive state), and signal charges accumulated in the photoelectric conversion unit PD are transferred to the floating diffusion region FD formed in the gate of the amplifier transistor M3. Further, when the control signal PTX is controlled to a low level, the transfer transistor M1 is in an off-state (nonconductive state). The floating diffusion region FD converts signal charges into a voltage, and the amplifier transistor M3 outputs a signal voltage in accordance with the gate voltage from the source to a signal line 101 via the select transistor M4. The drain of the amplifier transistor M3 is connected to a power source VDD.

The source of the reset transistor M2 is connected to the floating diffusion region FD, the drain is connected to the power source VDD, and a control signal PRES is applied to the gate via the signal line 111. When the control signal PRES is controlled to the high level, the reset transistor M2 is in the on-state, and the voltage of the power source VDD is supplied to the floating diffusion region FD. The select transistor M4 is provided between the amplifier transistor M3 and the signal line 101, and a control signal PSEL is applied to the gate of the select transistor M4 via a signal line 113. When the control signal PSEL is controlled to the high level, the select transistor M4 is in the on-state (conductive state), and the amplifier transistor M3 and the signal line 101 are electrically conducted. A load current source 210 is electrically connected to the signal line 101, and the load current source 210 supplies a constant bias current to the source of the amplifier transistor M3 via the signal line 101.

Figure 4:
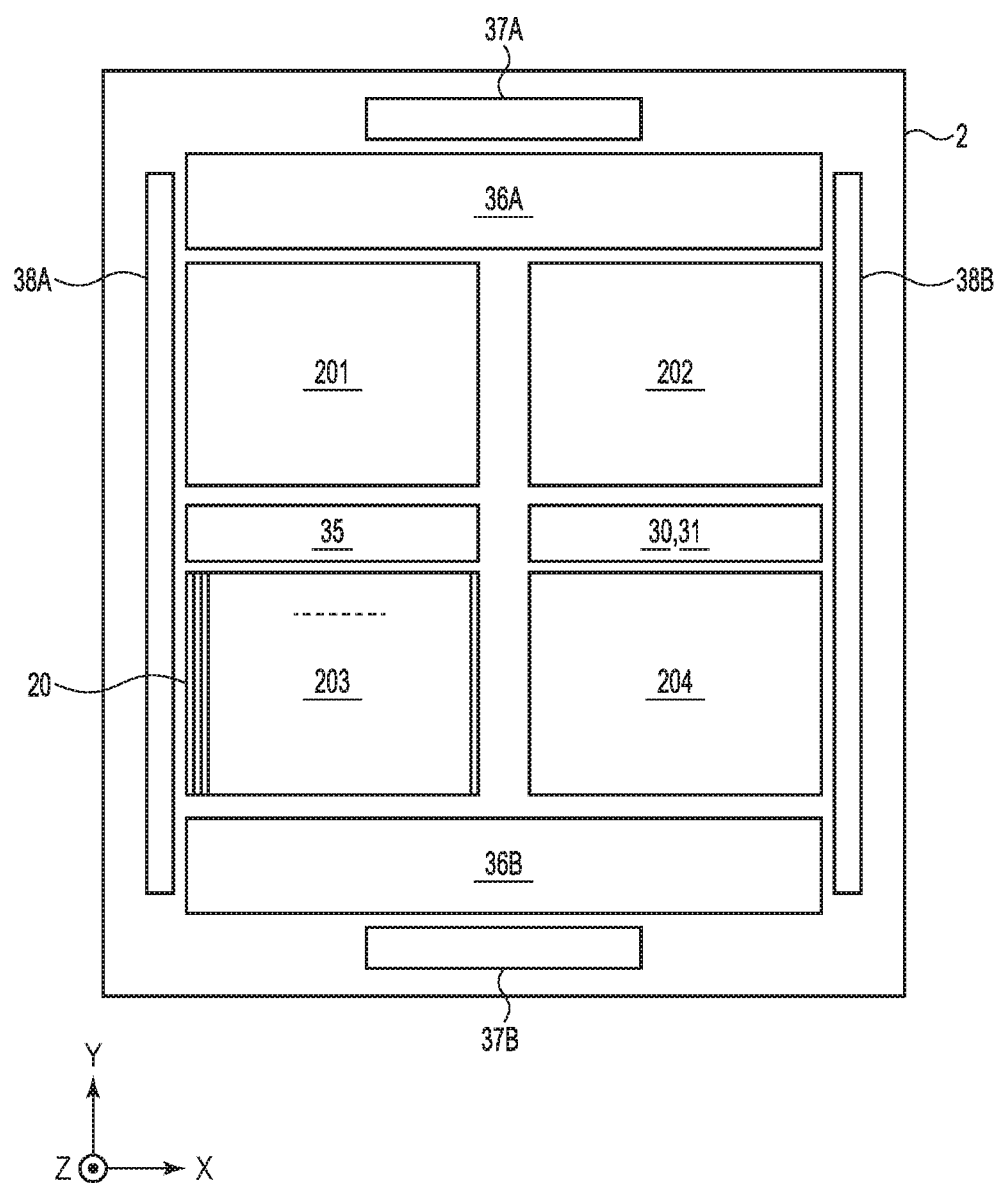
FIG. 4 is a diagram illustrating a circuit configuration and arrangement in a second semiconductor chip of the first embodiment.

FIG. 4 is a diagram illustrating the circuit configuration and arrangement in the second semiconductor chip 2 of the present embodiment. The second semiconductor chip 2 includes analog-to-digital converter (ADC) arrays 201 to 204, a timing generation circuit 30, a counter circuit 31, a reference signal generation circuit 35, signal processing circuits 36A and 36B, interface circuits 37A and 37B, and the vertical scanning circuits 38A and 38B.

Each of the ADC arrays 201 to 204 includes a plurality of AD conversion units 20. The AD conversion unit 20 extends in the Y direction (row direction), and a plurality of AD conversion units 20 are aligned in the X direction. FIG. 4 illustrates the four ADC arrays 201 to 204, and the ADC arrays 201 to 204 are provided in corresponding four regions divided from the pixel unit 100. Further, each of the ADC arrays 201 to 204 may be arranged to overlap the corresponding pixel region in plan view in the Z direction. Thereby, the wiring distance between the ADC arrays 201 to 204 and the divided pixel regions can be shorter. The ADC arrays 201 to 204 are arranged in a predetermined gap in the X direction and the Y direction, respectively. The reference signal generation circuit 35 is arranged between the ADC arrays 201 and 203. Similarly, the timing generation circuit 30 and the counter circuit 31 are arranged between the ADC arrays 202 and 204.

The reference signal generation circuit 35 generates a reference signal (ramp signal) whose voltage changes depending on time. The reference signal generation circuit 35 may be formed by using various schemes such as a capacitor charge/discharge scheme, a DAC scheme, a current steering scheme, or the like. The reference signal may be not only an upslope signal whose voltage increases with time but also a downslope signal whose voltage decreases with time. Furthermore, the reference signal may include a first reference signal and a second reference signal that have slopes different from each other. For example, the voltage change rate of the first reference signal is smaller than the voltage change rate of the second reference signal.

The counter circuit 31 performs measuring time of a counter for a count signal in synchronization with the reference signal, that is, performs counting up or counting down. The counter circuit 31 starts measuring clock pulse signals at the same time as the start of a voltage change of the reference signal of the reference signal generation circuit 35 and outputs a count signal. The count signal is supplied to the ADC arrays 201 to 204.

Each of the signal processing circuits 36A and 36B functions as a digital front end and performs signal processing on a digital signal output from the AD conversion unit 20. Each of the signal processing circuits 36A and 36B has a digital signal processor and performs digital signal processing such as digital gain, digital correlated double sampling, digital offset, linearity correction, or the like. The two signal processing circuits 36A and 36B are arranged to interpose the ADC arrays 201 to 204. The signal processing circuit 36A is arranged adjacent to the ADC arrays 201 and 202, and the signal processing circuit 36B is arranged adjacent to the ADC arrays 203 and 204. The signal processing circuit 36A processes a digital signal output from the ADC arrays 201 and 202, and the signal processing circuit 36B may process a digital signal output from the ADC arrays 203 and 204.

Each of the interface circuits 37A and 37B has a parallel-to-serial conversion circuit, a decoder, a shift register, a serial output circuit, or the like. The serial output circuit is a circuit of a low voltage differential signaling (LVDS) scheme, for example, and outputs signal-processed digital signal to the outside of the imaging device at high speed and low power consumption. The interface circuit 37A is provided adjacent to the signal processing circuit 36A and outputs a digital signal from the signal processing circuit 36A to the outside of the imaging device. Further, the interface circuit 37B is provided adjacent to the signal processing circuit 36B and outputs a digital signal from the signal processing circuit 36B to the outside of the imaging device.

The vertical scanning circuit 38A is provided adjacent to the ADC arrays 201 and 203, and the vertical scanning circuit 38B is provided adjacent to the ADC arrays 202 and 204. Each of the vertical scanning circuits 38A and 38B is formed of a shift register, a gate circuit, a buffer circuit, or the like and outputs control signals to the pixels 10 based on a vertical synchronization signal, a horizontal synchronization signal, a clock signal, or the like to drive the pixels 10 on a row basis or on a multiple-row basis. The signal lines 101 are provided for each column of the pixels 10, and the plurality of pixels 10 on the same column are connected to a common signal line 101.

The timing generation circuit 30 generates various control signals and drive signals based on a clock signal or a synchronization signal to control the ADC arrays 201 to 204, the counter circuit 31, the reference signal generation circuit 35, the signal processing circuits 36A and 36B, and the vertical scanning circuits 38A and 38B.

Figure 5:
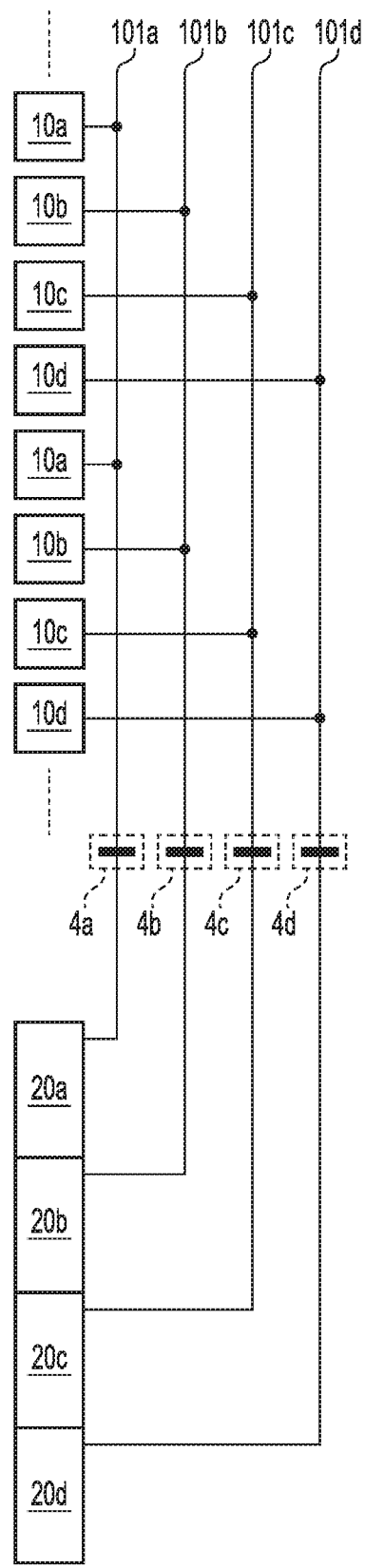
FIG. 5 is a diagram illustrating connection between pixels and AD conversion units of the first embodiment.

FIG. 5 is a diagram illustrating connection between pixels and AD conversion units of the present embodiment. In the imaging device of the present embodiment, four (first to fourth) AD conversion units 20a to 20d are provided to a group of pixels of the pixels 10 on a single column, and signals of the pixels 10 for four rows can be read out at the same time. The pixel 10a is connected to the first AD conversion unit 20a via a first signal line 101a and a junction portion 4a, and the pixel 10b is connected to the second AD conversion unit 20b via a second signal line 101b and a junction portion 4b. Further, the pixel 10c is connected to the third AD conversion unit 20c via a third signal line 101c and a junction portion 4c, and the pixel 10d is connected to the fourth AD conversion unit 20d via a fourth signal line 101d and a junction portion 4d. Note that the number of AD conversion units 20 provided on each column is not limited to the example of FIG. 5 and may be changed as appropriate.

By increasing the number of AD conversion units 20 provided on each column, it is possible to read out signals from the pixels 10 at a high rate.

Figure 6:
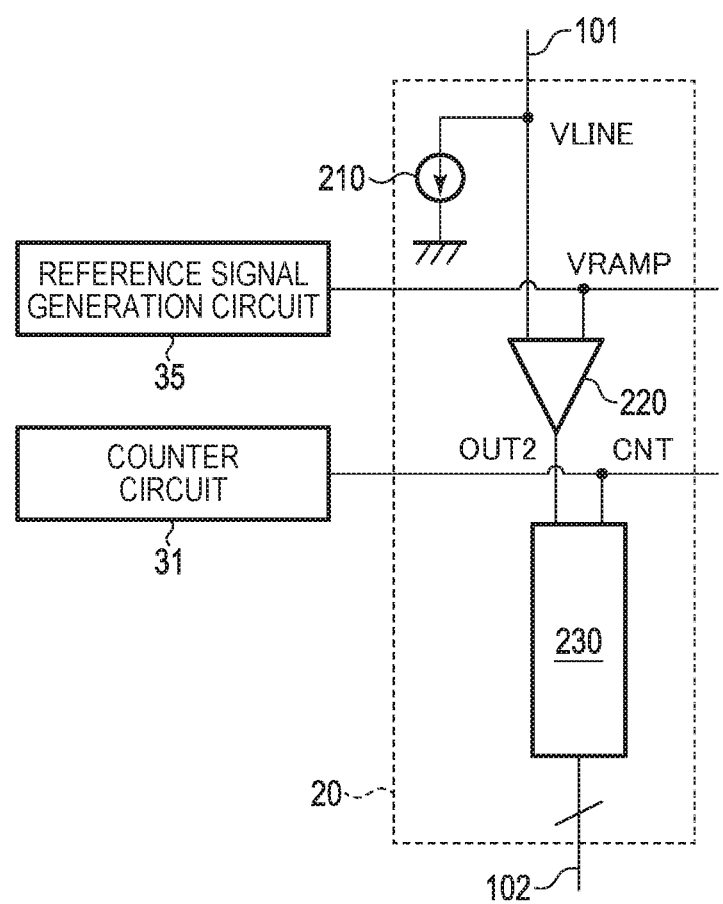
FIG. 6 is a block diagram of the AD conversion unit, a counter circuit, and a reference signal generation circuit of the first embodiment.

FIG. 6 is a block diagram of an AD conversion unit, a counter circuit, and a reference signal generation circuit of the present embodiment. The AD conversion unit 20 is provided to each signal line 101 and has a load current source 210, a comparator 220, and a memory 230. The load current source 210 is connected to the signal line 101 and functions as a load of the amplifier transistor M3. The comparator 220 includes a differential amplifier circuit and has a first input node, a second input node, and an output node. A signal VLINE, which is an analog signal, is input to the first input node from the pixel 10 via the signal line 101, and a reference signal VRAMP is input from the reference signal generation circuit 35 to the second input node. The comparator 220 outputs a comparison signal in accordance with a result of comparison between the signal VLINE and the reference signal VRAMP. The comparison signal is a binary digital signal with a high level or a low level. For example, when the voltage of the reference signal VRAMP is lower than the voltage of the signal VLINE, the comparison signal is at the low level, and when the voltage of the reference signal VRAMP is higher than the voltage of the signal VLINE, the comparison signal is at the high level. Further, a control signal used for reset may be input to the comparator 220 from the timing generation circuit 30.

The memory 230 is a digital memory that can hold a multibit digital signal. The memory 230 holds a count signal CNT output from the counter circuit 31 at a timing when the comparison signal is inverted from the high level to the low level. The count signal CNT held in the memory 230 represents a digital signal obtained by performing AD conversion on the signal VLINE.

The memory 230 can hold a digital signal obtained by performing AD conversion on a signal at a reset level of the floating diffusion region FD (hereafter, referred to as "N-signal") and a signal obtained by superimposing the N-signal on a signal of the photoelectric conversion unit PD (hereafter, referred to as "S-signal"). The N-signal and the S-signal held in the memory 230 are output to the signal processing circuits 36A and 36B via the signal line 102. Each of the signal processing circuits 36A and 36B performs a correlated double sampling process of subtracting the N-signal from the S-signal to output a digital signal from which a noise component has been removed.

Figure 7:
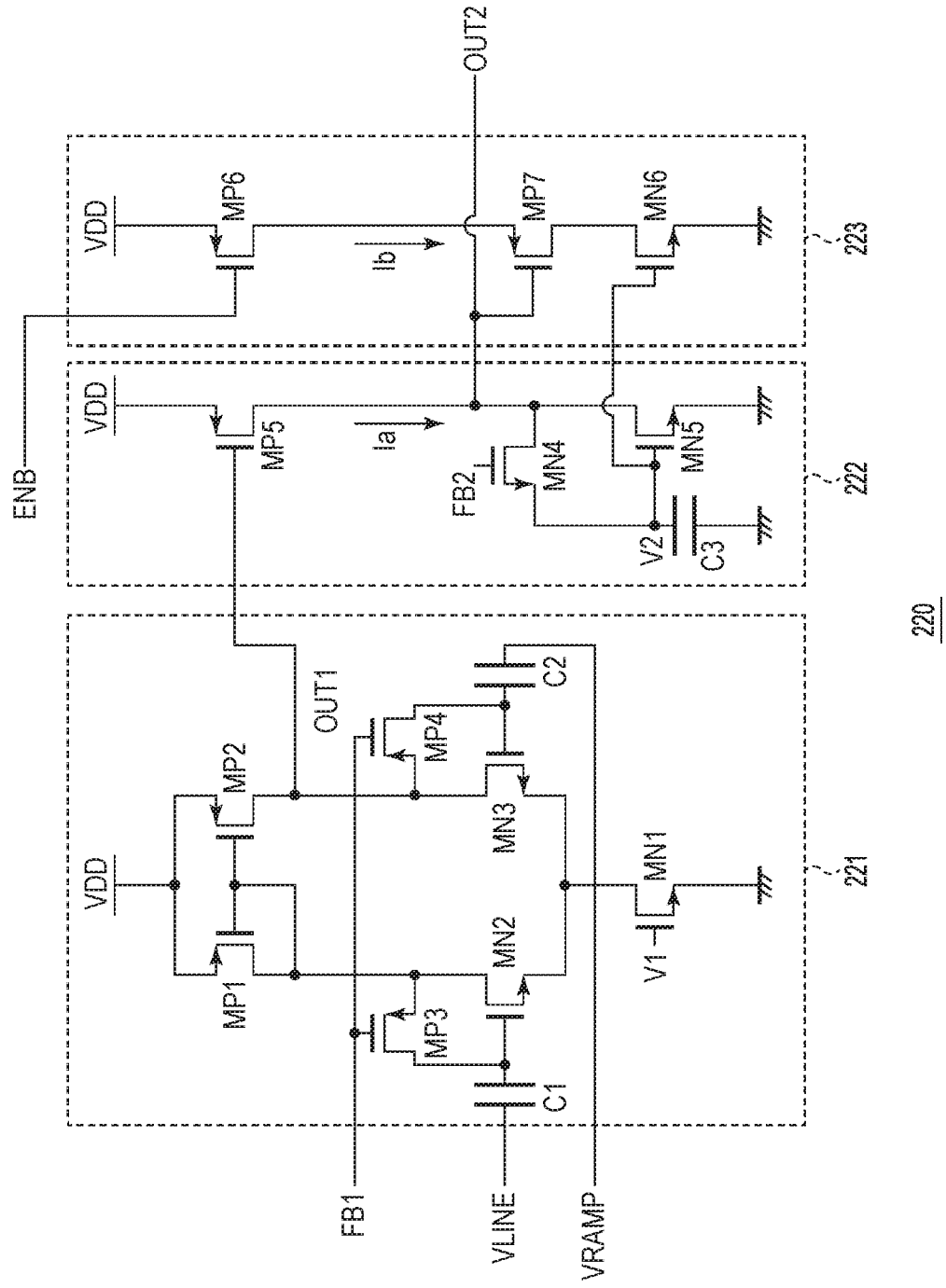
FIG. 7 is a diagram of a circuit example of a comparator of the first embodiment.

FIG. 7 is a diagram of a circuit example of a comparator of the present embodiment. The comparator 220 has a differential amplifier circuit 221, a source ground circuit 222, and a current compensation circuit 223.

The differential amplifier circuit 221 has a pair of N-type differential transistors MN2 and MN3, an N-type current source transistor MN1, a pair of P-type switch transistors MP3 and MP4, a pair of P-type load transistors MP1 and MP2, and input capacitors C1 and C2. The differential transistors MN2 and MN3 form a differential pair, and the sources thereof are connected to each other. The signal VLINE is input to the gate of the differential transistor MN2 from the pixel 10 via the input capacitor C1, and the reference signal VRAMP is input to the gate of the differential transistor MN3 via the input capacitor C2.

The current source transistor (constant current source transistor) MN1 functions as a current source of the differential transistors MN2 and MN3. The drain of the current source transistor MN1 is connected to the sources corresponding to a connection node of the differential transistors MN2 and MN3, and the source of the current source transistor MN1 is connected to a ground line (second power source line). A bias voltage V1 is applied to the gate of the current source transistor MN1 via a bias signal line common to the AD conversion units 20.

The load transistors MP1 and MP2 function as loads of the differential transistors MN2 and MN3, respectively. The drain of the load transistor MP1 is connected to the drain of the differential transistor MN2 and the gate of the load transistor MP1, and the source of the load transistor MP1 is connected to a power source line (first power source line). The drain of the load transistor MP2 is connected to the drain of the differential transistor MN3, and the source of the load transistor MP2 is connected to the power source line. The gates of the load transistors MP1 and MP2 are connected to each other, and the load transistors MP1 and MP2 form a current mirror transistor circuit. A signal OUT1 based on comparison (difference) between the signal VLINE and the reference signal VRAMP is output from the drain of the load transistor MP2.

The switch transistors MP3 and MP4 have a function of clamping signals of the input capacitors C1 and C2 at a predetermined voltage, respectively. The drain of the switch transistor MP3 is connected to the gate of the differential transistor MN2, and the source of the switch transistor MP3 is connected to the drain of the differential transistor MN2. Further, the drain of the switch transistor MP4 is connected to the gate of the differential transistor MN3, and the source of the switch transistor MP4 is connected to the drain of the differential transistor MN3. A clamp signal FB1 is input to the gates of the switch transistors MP3 and MP4. When the clamp signal FB1 is controlled to the low level, the switch transistors MP3 and MP4 are turned on, and the gate voltages of the differential transistors MN2 and MN3 are reset to a reference voltage.

The source ground circuit 222 has a P-type input transistor (first transistor) MP5, an N-type switch transistor MN4, an N-type load transistor (second transistor) MN5, and a holding capacitor C3. The gate of the input transistor MP5 is connected to the collector of the load transistor MP2 in the differential amplifier circuit 221, and the signal OUT1 is input to the gate. The source of the input transistor MP5 is connected to the power source line, and the drain of the input transistor MP5 is connected to the drain of the load transistor MN5. The load transistor MN5 is cascade-connected to the input transistor MP5, and a signal OUT2 inverted from the signal OUT1 is output from the connection node of the drain of the input transistor MP5 and the drain of the load transistor MN5.

The load transistor MN5 functions as a load of the input transistor MP5, and the source of the load transistor MN5 is connected to the ground line. The gate of the load transistor MN5 is connected to one electrode of the holding capacitor C3, and the other electrode of the holding capacitor C3 is connected to the ground line. The load transistor MN5 supplies a current Ia in accordance with a voltage V2 of the holding capacitor C3.

The switch transistor MN4 is provided between the gate and the drain of the load transistor MN5. That is, the source of the switch transistor MN4 is connected to the gate of the load transistor MN5, the drain of the switch transistor MN4 is connected to the drain of the load transistor MN5. A clamp signal FB2 is input to the gate of the switch transistor MN4. When the clamp signal FB2 is controlled to the high level, the switch transistor MN4 is turned on, and the voltage of the gate of the load transistor MN5 is reset to the reference voltage.

The current compensation circuit 223 has a P-type switch transistor (third transistor) MP6, an N-type current source transistor (fourth transistor) MN6, and a P-type current control transistor (fifth transistor) MP7. The gate of the current control transistor MP7 is connected to the drain of the load transistor MN5 and the drain of the input transistor MP5 of the source ground circuit 222, that is, connected to the connection node of both the drains, and the signal OUT2 is input to the gate. The drain of the current control transistor MP7 is connected to the drain of the current source transistor MN6. The source of the current source transistor MN6 is connected to the ground voltage, and the gate of the current source transistor MN6 is connected to the gate of the load transistor MN5 of the source ground circuit 222. Herein, when the current source transistor MN6 and the load transistor MN5 have the same size and the same bias condition, the current source transistor MN6 and the load transistor MN5 may cause the same current to flow. The current control transistor MP7 is driven by the signal OUT2 inverted from the signal OUT1 and can cause a current Ib that offsets a fluctuation of the current Ia of the source ground circuit 222 to flow. The current Ib changes complementarily with respect to the change of the current Ia, and voltage fluctuations of the power source line and the ground line may be suppressed.

The source of an enable switch transistor MP6 is connected to the power source line, and the drain of the enable switch transistor MP6 is connected to the source of the current control transistor MP7. An enable signal ENB is input to the gate of the enable switch transistor MP6. When the enable signal ENB is controlled to the low level, the enable switch transistor MP6 is turned on, and the current Ib is supplied to the current control transistor MP7.

Figure 8:
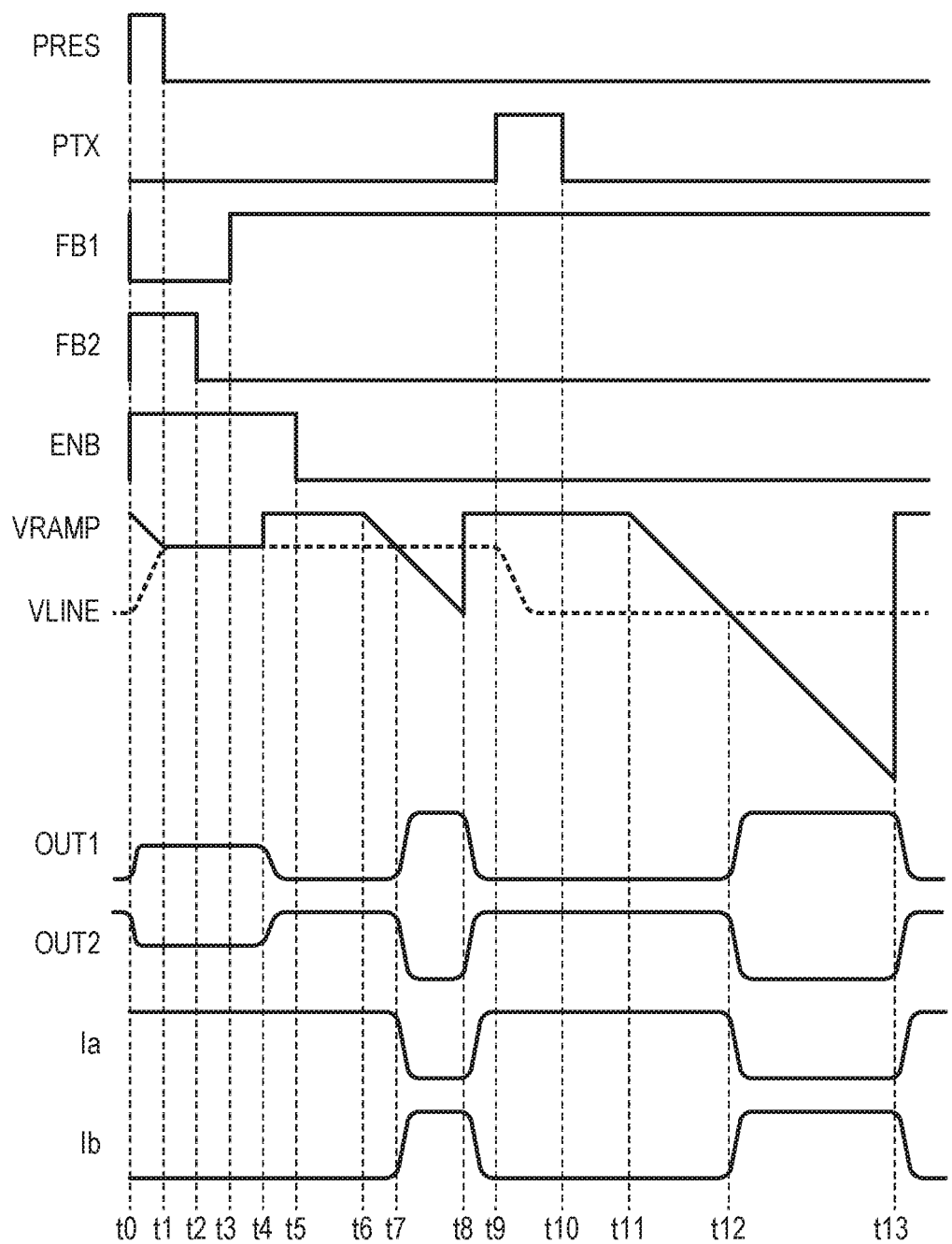
FIG. 8 is a timing chart illustrating the operation of the imaging device of the first embodiment.

FIG. 8 is a timing chart illustrating the operation in the imaging device of the present embodiment. At time t0, since the clamp signal FB1 is at an active level (low level), the switch transistors MP3 and MP4 are in the conductive state. Further, since the clamp signal FB2 is at an active level (high level), the switch transistor MN4 is in the conductive state. Since the enable signal ENB is at a non-active level (high level), the enable switch transistor MP6 is in the nonconductive state.

During time t0 to t1, the vertical scanning circuits 38A and 38B control the control signal PRES to the active level (high level). The reset transistor M2 is in the conductive state, the voltage of the floating diffusion region FD is reset at the voltage of the power source VDD, and the voltage of the signal VLINE of the signal line 101 increases. At time t1, the control signal PRES is controlled from the high level to the low level. The amplifier transistor M3 outputs the signal VLINE, which corresponds to the potential of the floating diffusion region FD released from reset, to the signal line 101 via the select transistor M4. Herein, the signal VLINE corresponds to a noise signal.

Further, during time t0 to t1, the reference signal generation circuit 35 causes the reference signal VRAMP to transition from a reset level to an offset level. Herein, the reset level of the reference signal VRAMP is the initial level of the reference signal VRAMP at the start of an AD conversion operation described later. The offset level is a level offset by a constant voltage from the reset level in the same direction as the voltage change direction at the time of an AD conversion operation. The offset level is a reference level at the time of an AD conversion operation. The signal VLINE, which is a noise signal in this period, is sampled by the input capacitor C1, and the reference signal VRAMP at the offset level is sampled by the input capacitor C2. The signals OUT1 and OUT2 are predetermined voltages defined by the balance of the drive power of transistors. The signal OUT2 is sampled by the holding capacitor C3.

At time t2, the clamp signal FB2 transitions from the active level (high level) to the non-active level (low level). The switch transistor MN4 enters the nonconductive state, and the signal OUT2 is held in the holding capacitor C3. The load transistor MN5 causes the current Ia corresponding to the voltage of the holding capacitor C3 to flow.

At time t3, the clamp signal FB1 transitions from the active level (low level) to the non-active level (high level), and the switch transistors MP3 and MP4 enter the nonconductive state. Thereby, the signal VLINE and the reference signal VRAMP are held in the input capacitors C1 and C2, respectively.

At time t4, the reference signal generation circuit 35 causes the reference signal VRAMP to transition from the offset level to the reset level. The signal OUT1 output from the differential amplifier circuit 221 transitions to the low level, and the signal OUT2 output from the source ground circuit 222 transitions to the high level.

At time t5, the enable signal ENB transitions from the non-active level (high level) to the active level (low level). The enable switch transistor MP6 enters the conductive state, and the power source VDD is applied to the drain of the current control transistor MP7. However, since the signal OUT2 is at the high level, no current flows in the current control transistor MP7.

At time t6, the reference signal generation circuit 35 starts changing the reference signal VRAMP at a constant slope (voltage change rate), and the counter circuit 31 starts measuring the count signals.

At time t7, when the reference signal VRAMP reaches the signal VLINE at a clamp level, the signal OUT1 is inverted from the low level to the high level. The input transistor MP5 enters the nonconductive state, and the current Ia no longer flows in the source ground circuit 222. When the signal OUT2 of the source ground circuit 222 is inverted from the high level to the low level, the memory 230 holds the count signal CNT. Further, the signal OUT2 is controlled to the low level, and thereby the current control transistor MP7 of the current compensation circuit 223 enters the conductive state. Thereby, the current Ib corresponding to the gate potential of the current source transistor MN6 flows in the current compensation circuit 223.

Herein, it is preferable that the current source transistor MN6 of the current compensation circuit 223 have the same size as the size of the load transistor MN5 of the source ground circuit 222. The gates of the current source transistor MN6 and the load transistor MN5 are connected to each other. Thus, it is possible to cause the same current to flow in the current source transistor MN6 and the load transistor MN5 under the same bias condition. The load transistor MN5 during time t0 to t7 and the current source transistor MN6 during time t7 to t8 are in a saturation state, respectively. Thus, the current Ia during time t0 to t7 and the current Ib during time t7 to t8 are substantially the same. In the inversion operation of the comparator 220 at time t7, the current Ib of the current compensation circuit 223 is converted so as to offset a fluctuation of the current Ia of the source ground circuit 222. That is, the sum of the currents Ia and Ib is constant. Thus, it is possible to suppress current fluctuations of the entire comparator 220 in the AD conversion period.

At time t8, the reference signal generation circuit 35 causes the reference signal VRAMP to transition to the reset level, and the AD conversion of the signal VLINE at reset of the pixels 10 is completed. The signal OUT1 transitions from the high level to the low level, and the input transistor MP5 enters the conductive state, and thereby the current Ia flows. On the other hand, the signal OUT2 transitions from the low level to the high level, the current control transistor MP7 enters the nonconductive state, and thereby the current Ib is stopped.

During time t9 to t10, the vertical scanning circuits 38A and 38B control the control signal PTX to the active level (high level). The transfer transistor M1 enters the conductive state, and charges generated and accumulated in the photoelectric conversion unit PD are transferred to the floating diffusion region FD. The voltage of the floating diffusion region FD is a voltage corresponding to charges generated by the photoelectric conversion unit PD. The amplifier transistor M3 outputs the signal VLINE, which corresponds to the voltage of the floating diffusion region FD, to the signal line 101 via the select transistor M4. Herein, the signal VLINE includes a noise signal in addition to the signal based on the incident light.

At time t11, the reference signal generation circuit 35 starts changing the reference signal VRAMP at a constant slope (voltage change rate), and the counter circuit 31 starts measuring the count signals.

At time t12, when the reference signal VRAMP reaches the signal VLINE, the signal OUT1 is inverted from the low level to the high level. The input transistor MP5 enters the nonconductive state, and the current Ia no longer flows in the source ground circuit 222. When the signal OUT2 of the source ground circuit 222 is inverted from the high level to the low level, the memory 230 holds the count signal CNT. Further, the signal OUT2 is controlled to the low level, and thereby the current control transistor MP7 of the current compensation circuit 223 enters the conductive state. Thereby, the current Ib corresponding to the gate potential of the current source transistor MN6 flows in the current compensation circuit 223. The current compensation circuit 223 causes the current Ib that offsets a fluctuation of the current Ia of the source ground circuit 222 to flow, and thereby it is possible to suppress current fluctuations of the entire comparator 220.

On and after time t13, the signal processing circuits 36A and 36B each read out a digital signal at the time of reset and a digital signal as the time of photoelectric conversion from the memory 230. The signal processing circuits 36A and 36B each perform a correlated double sampling process on the two digital signals and obtain a signal from which a noise component has been removed.

Figure 9:
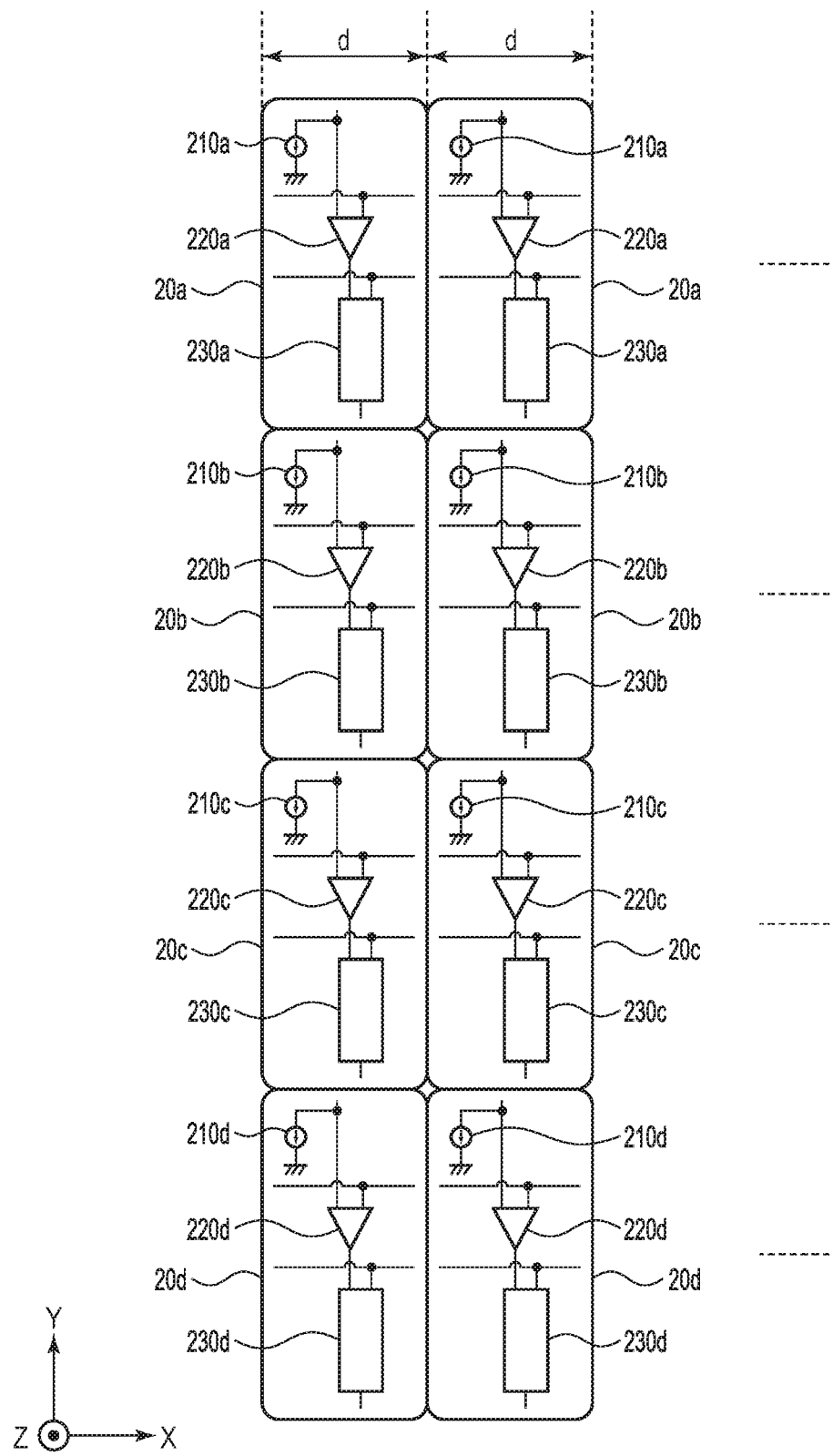
FIG. 9 is a diagram illustrating an example of the arrangement of the AD conversion units of the first embodiment.
Figure 10:
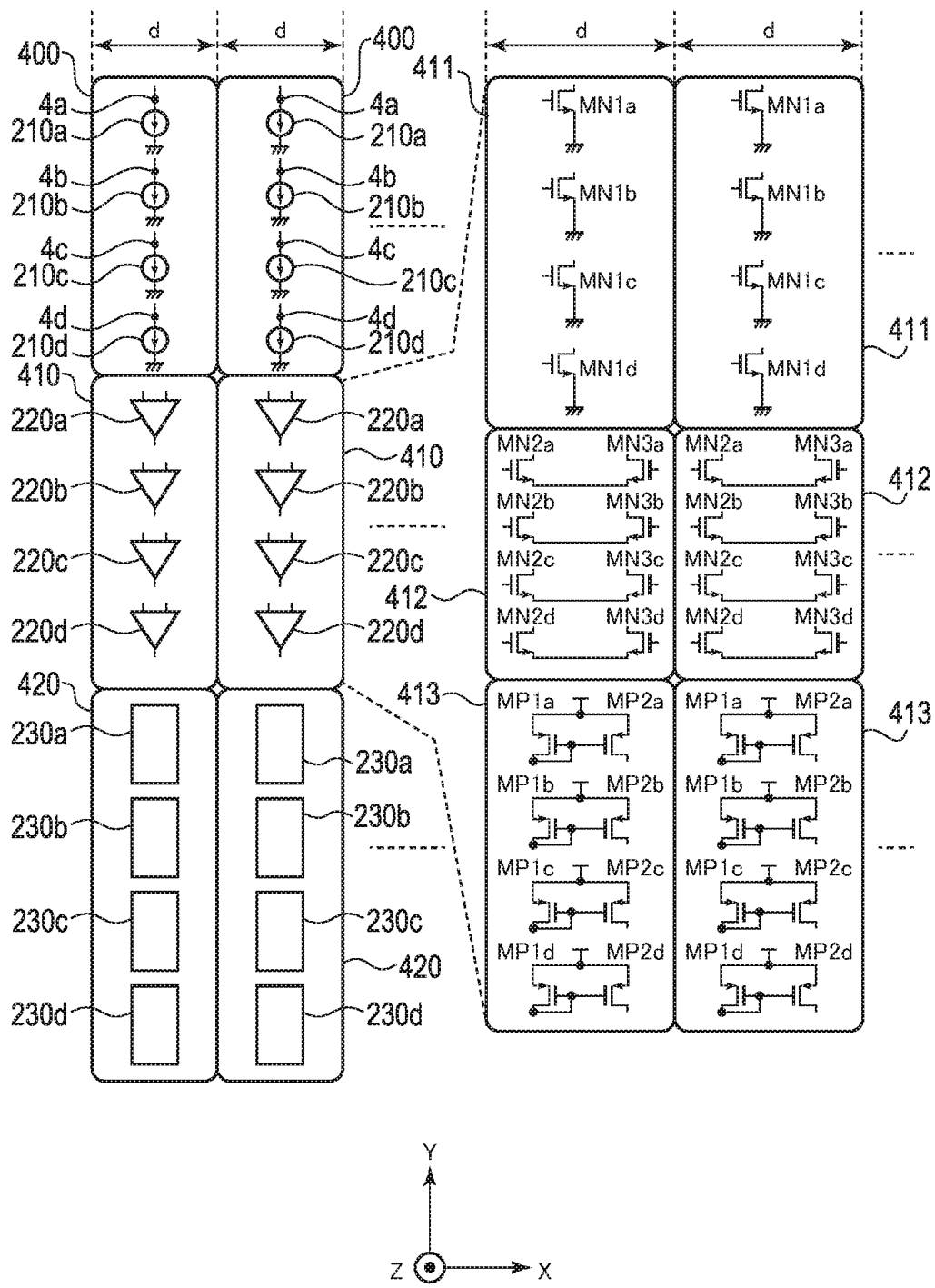
FIG. 10A and FIG. 10B are diagrams illustrating the arrangement of circuit components forming the AD conversion units of the first embodiment.

FIG. 9, FIG. 10A and FIG. 10B are diagrams illustrating the arrangement of circuit elements forming the AD conversion unit and schematically illustrate the arrangement of the four AD conversion units 20a to 20d illustrated in FIG. 5.

FIG. 9 is a diagram illustrating an example of the arrangement of the AD conversion units 20a to 20d of the present embodiment. In FIG. 9, the four AD conversion units 20a to 20d are arranged on each column on the second semiconductor chip 2. Herein, the region of the AD conversion units 20a to 20d on each column has a width d in the column direction (X direction), and the AD conversion units 20a to 20d for four rows are aligned in the row direction (Y direction). The memory 230a that operates at a high speed as a digital circuit is arranged between the comparator 220a and the load current source 210b that operate as analog circuits. Similarly, the memory 230b is arranged between the comparator 220b and the load current source 210c, and the memory 230c is arranged between the comparator 220c and the load current source 210d. Thus, switching noise occurring in the memory 230 may be mixed in the comparator 220 and the load current source 210, which are analog circuits, and may cause image quality deterioration.

Furthermore, if the signal processing circuit 36B is arranged in the downward direction (-Y direction) of the AD conversion unit 20d, the digital signal output from the memory 230a passes through the regions of the AD conversion units 20b, 20c, and 20d. Thus, a digital signal output from the memory 230a of the AD conversion unit 20a may be mixed in the other AD conversion units 20b, 20c, and 20d due to crosstalk and may cause image quality deterioration.

Further, in FIG. 9, the load current sources 210a to 210d are arranged apart from each other, and similarly, the comparators 220a to 220d are arranged apart from each other. If a power source is supplied to the load current sources 210a to 210d and the comparators 220a to 220d from the upper side (Y direction) or the lower side (-Y direction) of the drawing sheet, the lengths of power source lines for the AD conversion unit 20a on the first row to the AD conversion unit 20d on the fourth row will be different, and the impedances of the power source lines will also be different. Thus, output on respective rows of the AD conversion units 20a to 20d may differ from each other, and image quality deterioration such as fixed pattern noise may occur.

To prevent the image quality deterioration described above, it is considered to employ the arrangement illustrated in FIG. 10A and FIG. 10B, for example. In FIG. 10A, first regions 400, second regions 410, and third regions 420 are aligned in the column direction (Y direction). Each of the first regions 400, the second regions 410, and the third regions 420 is a continuous region of the second semiconductor chip 2.

The load current sources 210a to 210d are arranged collectively or together in continuous first regions 400 of the second semiconductor chip 2. The expression that two circuit components (for example, load current sources) are collectively arranged means that no element of a circuit component having another function is arranged between the two circuit components. Further, the load current source 210a to 210d are aligned in the column direction (Y direction). In such a way, the load current sources 210a to 210d are arranged adjacent to each other in the first region 400 to form a group of load current sources. Similarly, the comparators 220a to 220d are arranged together in continuous second regions 410 of the second semiconductor chip 2. The comparators 220a to 220d are aligned in the column direction (Y direction). In such a way, the comparators 220a to 220d are arranged adjacent to each other in the second region 410 to form a group of comparators. Further, the memories 230a to 230d are arranged together in continuous third regions 420 of the second semiconductor chip 2. The memories 230a to 230d are aligned in the column direction (Y direction). In such a way, the memories 230a to 230d are arranged adjacent to each other in the third region 420 to form a group of memories.

As illustrated in FIG. 10A, by arranging the same type of circuit components together, it is possible to reduce crosstalk between different types of circuit components. Note that the circuit components corresponding to the pixels 10 of the same color may be arranged in the same region to avoid crosstalk between different colors. Further, in each region, with a plurality of circuit components (load current sources, comparators, or memories) being aligned in the column direction, a column circuit having sufficient functions can be arranged in a narrow region corresponding to a single pixel column.

The first to fourth memories 230a to 230d, which are digital circuits, are arranged together in the third region 420 that is different from the first region 400 and the second region 410 used for analog circuits. The group of current sources and the group of comparators, which are analog circuits, are arranged adjacent to each other and separated from the group of memories, which are digital circuits, in plan view. Thus, it is possible to prevent noise occurring in the memories 230a to 230d from being mixed in the load current sources 210a to 210d and the comparators 220a to 220d. Further, when the signal processing circuit 36B is located in the downward direction (-Y direction) of the third region 420, the group of memories is arranged between the group of comparators and the signal processing circuit 36B. Thus, there is no need to arrange signal lines of digital signals output from the memories 230a to 230d in the first region 400 and the second region 410 used for analog circuits, and it is possible to effectively suppress image quality deterioration due to crosstalk of signals. Furthermore, compared to the arrangement of FIG. 9, the distance between the same circuit components on the first row to the fourth row is smaller. The difference in the length of respective power source lines of the AD conversion units 20a to 20d is smaller, and the difference in the impedance of respective power source lines is also smaller. As a result, it is possible to suppress image quality deterioration due to the difference in the length of power source lines.

Note that, when the load current sources 210a to 210d are arranged in the first region 400, it is desirable that the junction portions 4a to 4d be arranged at a position that at least partially overlaps the first region 400 in plan view or a position close to the first region 400. In particular, in the arrangement illustrated in FIG. 4, by arranging the junction portions 4a to 4d near the load current sources 210a to 210d, it is possible to reduce the wiring length of the signal lines 101 in the second semiconductor chip 2 and perform signal readout from the pixels 10 at a high speed.

FIG. 10B is a diagram illustrating the arrangement of circuit components of comparators (comparator components). The second region 410 of the comparator 220 on each column is further divided into a plurality of sub-regions. FIG. 10B illustrates sub-regions 411, 412, and 413 for circuit components of the differential amplifier circuits 221 forming the comparators 220. Each of the sub-regions 411, 412, and 413 has a width d in the column direction (X direction), and circuit components of the differential amplifier circuits 221 for four rows are aligned along the row direction (Y direction). Although FIG. 10B illustrates only the three sub-regions 411, 412, and 413 of the differential amplifier circuit 221, other multiple sub-regions forming the source ground circuit 222 or the current compensation circuit 223 may be formed continuously in a similar manner as described later. Current source transistors MN1a to MN1d on each column are arranged adjacent to each other in the third sub-region 411, and multiple pairs of differential transistors MN2a to MN2d and MN3a to MN3d are arranged adjacent to each other along the Y direction in the first sub-region 412. A pair of the differential transistors MN2 and MN3, for example, the differential transistors MN2a and MN3a are aligned in the X direction. Load transistors MP1a to MP1d and MP2a to MP2d are arranged adjacent to each other along the Y direction in the second sub-region 413. A pair of the load transistors MP1 and MP2, for example, the load transistors MP1a and MP2a are aligned in the X direction.

The circuit components forming the comparator 220 affect the performance of the comparator 220. By arranging circuit components having the same function in the four comparators 220 in the same sub-region, it is possible to unify the performance of the comparators 220 on each row. It is possible to suppress variation among transistors having the same function and unify the performances of the AD conversion units 20 on each row in addition to further reduce the difference in the impedance of the power source lines on each row.

Figure 11:
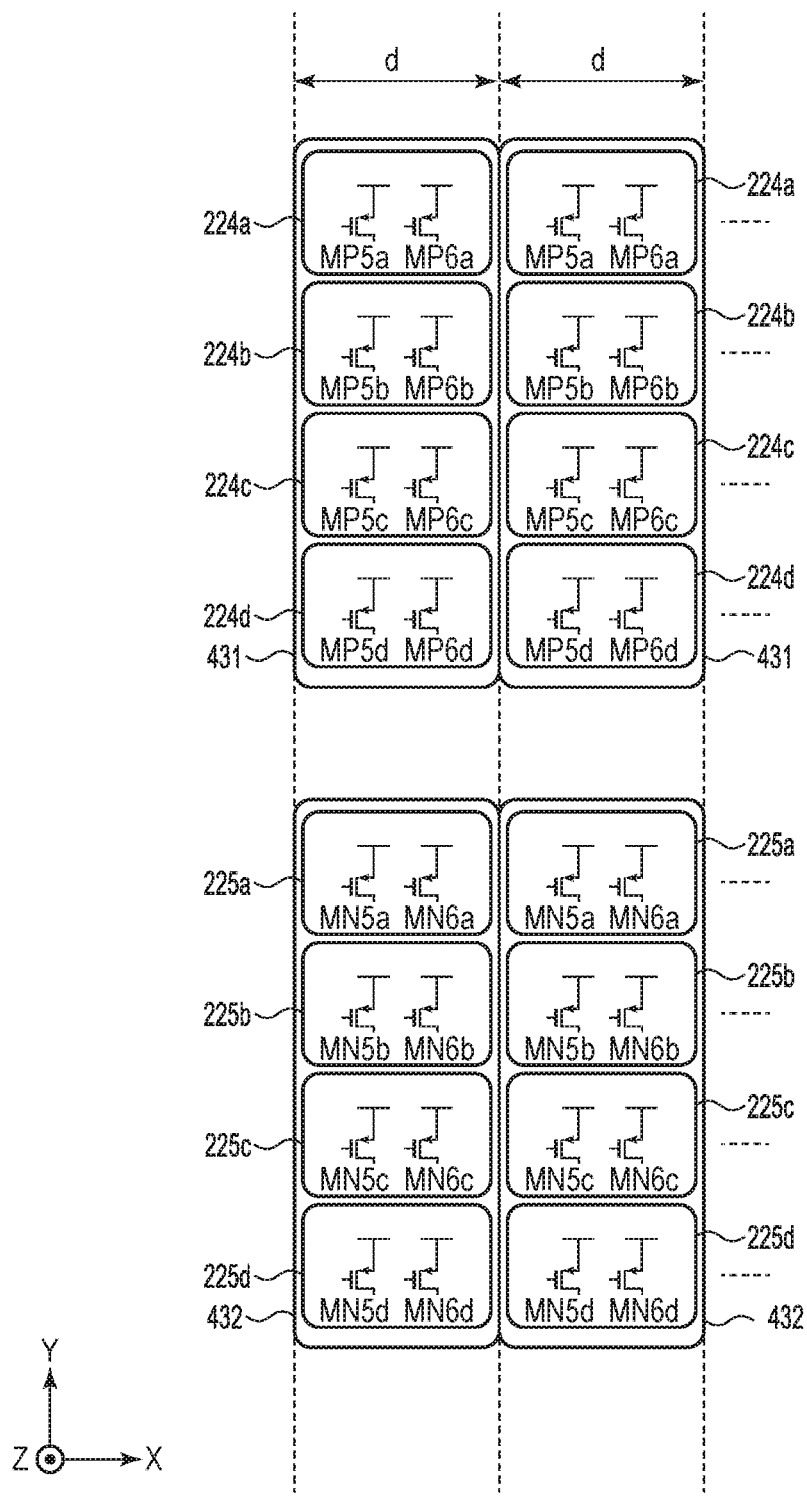
FIG. 11 is a diagram illustrating the arrangement of circuit components of the comparators of the first embodiment.

FIG. 11 is a diagram illustrating the arrangement of circuit components of the comparators (comparator components) of the present embodiment and illustrates sub-regions for circuit components of the source ground circuits and the current compensation circuits. Sub-regions 431 and 432 for the source ground circuits 222 and the current compensation circuits 223 on each column have a width d in the column direction (X direction) and are aligned along the row direction (Y direction). Each of the sub-regions 431 and 432 may include circuit components of the source ground circuits 222 and the current compensation circuits 223 on a four-row basis. As described above, the source ground circuit 222 and the current compensation circuit 223 operate so as to offset respective current fluctuations. If the source ground circuit 222 and the current compensation circuit 223 were arranged away from each other, a difference would occur in the respective impedances of the power source line of the source ground circuit 222 and the power source line of the current compensation circuit 223. As a result, the effect to offset current fluctuations would be reduced, and image quality deterioration would occur.

As illustrated in FIG. 11, the circuit components of the source ground circuits 222 and the current compensation circuits 223 for four rows are classified in multiple groups of elements. Each group of elements 224a to 224d includes input transistors MP5a to MP5d of the source ground circuit 222 and enable switch transistors MP6a to MP6d of the current compensation circuit 223. The groups of elements 224a to 224d are arranged in the fourth sub-region 431. Each group of elements 225a to 225d includes load transistors MN5a to MN5d of the source ground circuit 222 and current source transistors MN6a to MN6d of the current compensation circuit 223. The groups of elements 225a to 225d are arranged in the fifth sub-region 432. Each of the group of elements 224a to 224d and the group of elements 225a to 225d includes a circuit that processes the same signal, that is, circuit elements of the AD conversion unit 20 connected to the same signal line 101. For example, the group of elements (first group of elements) 224a includes the input transistor MP5a and the enable switch transistor MP6a forming the first comparator 220a on the first row, and the group of elements (second group of elements) 224b includes the input transistor MP5b and the enable switch transistor MP6b forming the second comparator 220b on the first row. Further, the group of elements (third group of elements) 225a includes the load transistor MN5a and the current source transistor MN6a forming the first comparator 220a on the first row, and the group of elements (fourth group of elements) 225b includes the load transistor MN5b and the current source transistor MN6b forming the second comparator 220b on the first row. The group of elements 224a to 224d on a four-row basis are arranged in the sub-region 431, and the group of elements 225a to 225d on a four-row basis are arranged in the sub-region 432. It is desirable that a plurality of circuit components forming the same group of elements be arranged adjacent to each other in the row direction (X direction) and the column direction (Y direction) or arranged to interpose another transistor of at least the same polarity. According to the arrangement illustrated in FIG. 11, since the circuit components forming the source ground circuits 222 and the current compensation circuits 223 are arranged close to each other, it is possible to reduce the difference in the impedance of the power source lines and effectively offset current fluctuations.

Figure 12:
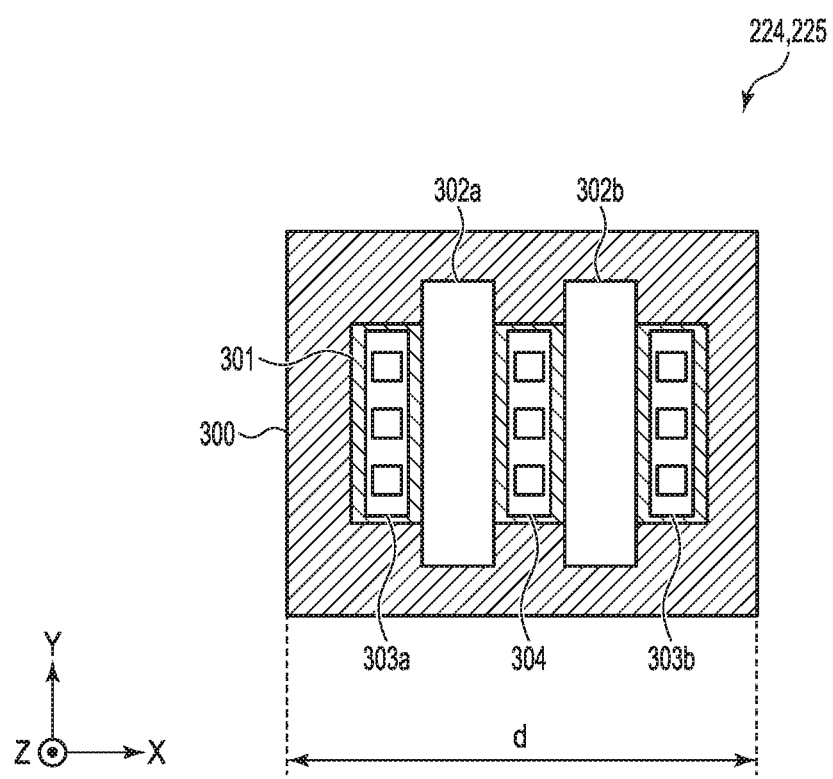
FIG. 12 is a diagram illustrating an arrangement example of transistors of the first embodiment.
Figure 13:
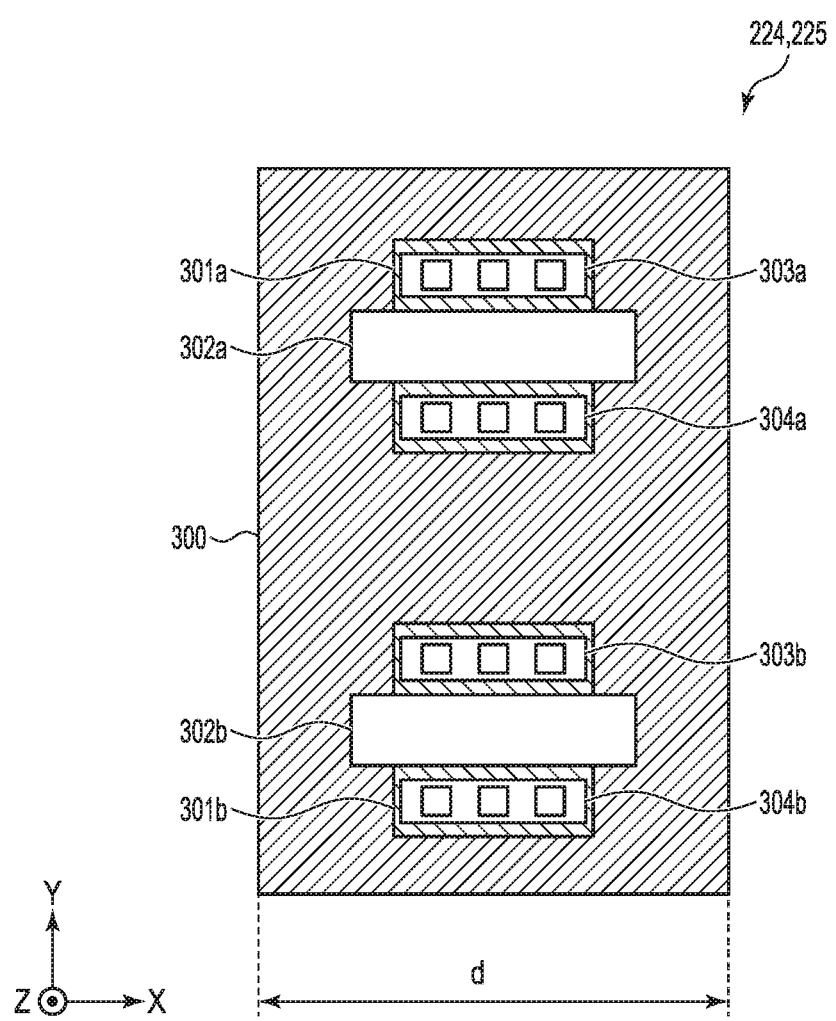
FIG. 13 is a diagram illustrating an arrangement example of transistors of the first embodiment.

FIG. 12 and FIG. 13 illustrate an arrangement example of transistors of the present embodiment, which illustrate the group of elements 224 and the group of elements 225 for one row. Herein, the group of elements 224 and the group of elements 225 each include a pair of transistors forming the source ground circuit 222 and the current compensation circuit 223. For example, the group of elements 224 may include the input transistor MP5 and the enable switch transistor MP6, and the group of elements 225 may include the load transistor MN5 and the current source transistor MN6.

In FIG. 12, each of the group of elements 224 and the group of elements 225 is formed in a well region 300 of one conductivity type. The well region 300 is formed on each column and has a width d in the column direction (X direction). A diffusion region 301 is a region formed in the well region 300 and having a conductivity type of the opposite polarity to the well region 300. In the diffusion region 301, gate electrodes 302a and 302b, drain regions 303a and 303b, and a source region 304 are formed. For example, the gate electrode 302a, the drain region 303a, and the source region 304 may form the input transistor MP5, and the gate electrode 302b, the drain region 303b, and the source region 304 may form the enable switch transistor MP6. Each of the drain regions 303a and 303b and the source region 304 forms a rectangular extending in the row direction (Y direction) in plan view, and a plurality of contact regions are formed along the column direction, respectively. The source region 304 is arranged between the two drain regions 303a and 303b. The gate electrode 302a extending in the row direction (Y direction) is formed between the drain region 303a and the source region 304 in plan view. The gate electrode 302b extending in the row direction (Y direction) is formed between the drain region 303b and the source region 304 in plan view. The source region 304 is shared by the input transistor MP5 and the enable switch transistor MP6. A pair of the input transistor MP5 and the enable switch transistor MP6 are aligned in the direction (X direction) intersecting a direction of one column formed of a group of pixels. Similarly, in the group of elements 225, the load transistor MN5 and the current source transistor MN6 are formed, and the source region 304 may be shared by the load transistor MN5 and the current source transistor MN6. A pair of the load transistor MN5 and the current source transistor MN6 are aligned in the X direction.

In FIG. 13, two diffusion regions 301a and 301b of a conductivity type of the opposite polarity are formed in the well region 300 of one conductivity type. The group of elements 224 and the group of elements 225 may be formed in the diffusion regions 301a and 301b. The well region 300 is arranged on each column and has a width d in the column direction (X direction). The two diffusion regions 301a and 301b are aligned in the row direction (Y direction). The input transistor MP5 formed of the gate electrode 302a, the drain region 303a, and source region 304a is formed in the diffusion region 301a. Further, the enable switch transistor MP6 formed of the gate electrode 302b, the drain region 303b, and the source region 304b is formed in the diffusion region 301b. A pair of the input transistor MP5 and the enable switch transistor MP6 are arranged along the Y direction. The input transistor MP5 and the enable switch transistor MP6 do not share the diffusion region but are formed in the common well region 300. Similarly, the load transistor MN5 and the current source transistor MN6 may be formed in the group of elements 225. A pair of the load transistor MN5 and the current source transistor MN6 are arranged along the Y direction.

As illustrated in FIG. 12 and FIG. 13, when a pair of transistors that offset current are arranged close to each other, the offset effect provided by the current compensation circuit 223 can be further enhanced. Also in the imaging device that has a plurality of stacked semiconductor chips and can further read out a plurality of rows in parallel, current fluctuation caused by the source ground circuit 222 can be suppressed effectively by the current compensation circuit 223. In particular, in the arrangement of FIG. 12, a pair of transistors are arranged close to each other and formed in the common diffusion region 301. It is therefore possible to have good symmetry of the sizes and the bias conditions of a pair of transistors and more effectively compensate fluctuations of the current Ia of the source ground circuit 222 by using the current Ib of the current compensation circuit 223.

Note that only any one of the groups of elements 224 and 225 may be arranged as illustrated in FIG. 12 and FIG. 13. A pair of transistors of at least the source ground circuit 222 and the current compensation circuit 223 are arranged near the same region, and thereby the effect of current offset by the current compensation circuit 223 can be enhanced. Further, the arrangement of transistors is not limited to the example of FIG. 12 and FIG. 13, the gate electrodes 302a and 302b, the drain regions 303a and 303b, and the source region 304 may be arranged with 90-degree rotation. Further, another circuit component such as the holding capacitor C3, the switch transistor MN4, or the like may be formed in the group of elements 225, and furthermore, another circuit component may be arranged within the same well. For example, the first holding capacitor C3 and the first switch transistor MN4 forming the first comparator 220a may be further arranged in the group of elements 225a, and the second holding capacitor C3 and the second switch transistor MN4 forming the second comparator 220b may be further arranged in the group of elements 225b.

Furthermore, the arrangement illustrated in FIG. 12 and FIG. 13 is not necessarily limited to the configuration in which a plurality of AD conversion units 20 are provided on each column. With application of the arrangement of FIG. 12 and FIG. 13 in a single AD conversion unit 20, the symmetry of a pair of transistors can be improved, and the effect of current compensation can be enhanced.

As described above, according to the present embodiment, it is possible to efficiently arrange AD conversion units and improve image quality in an imaging device having the stack structure. In particular, in an imaging device that can read out a plurality of rows in parallel, when the same type of circuit components included in a plurality of AD conversion units are arranged together, a reduction of crosstalk between signal lines and a reduction of the difference in the impedance of power source lines are achieved, and image quality can be further improved.

Second Embodiment

Figure 14:
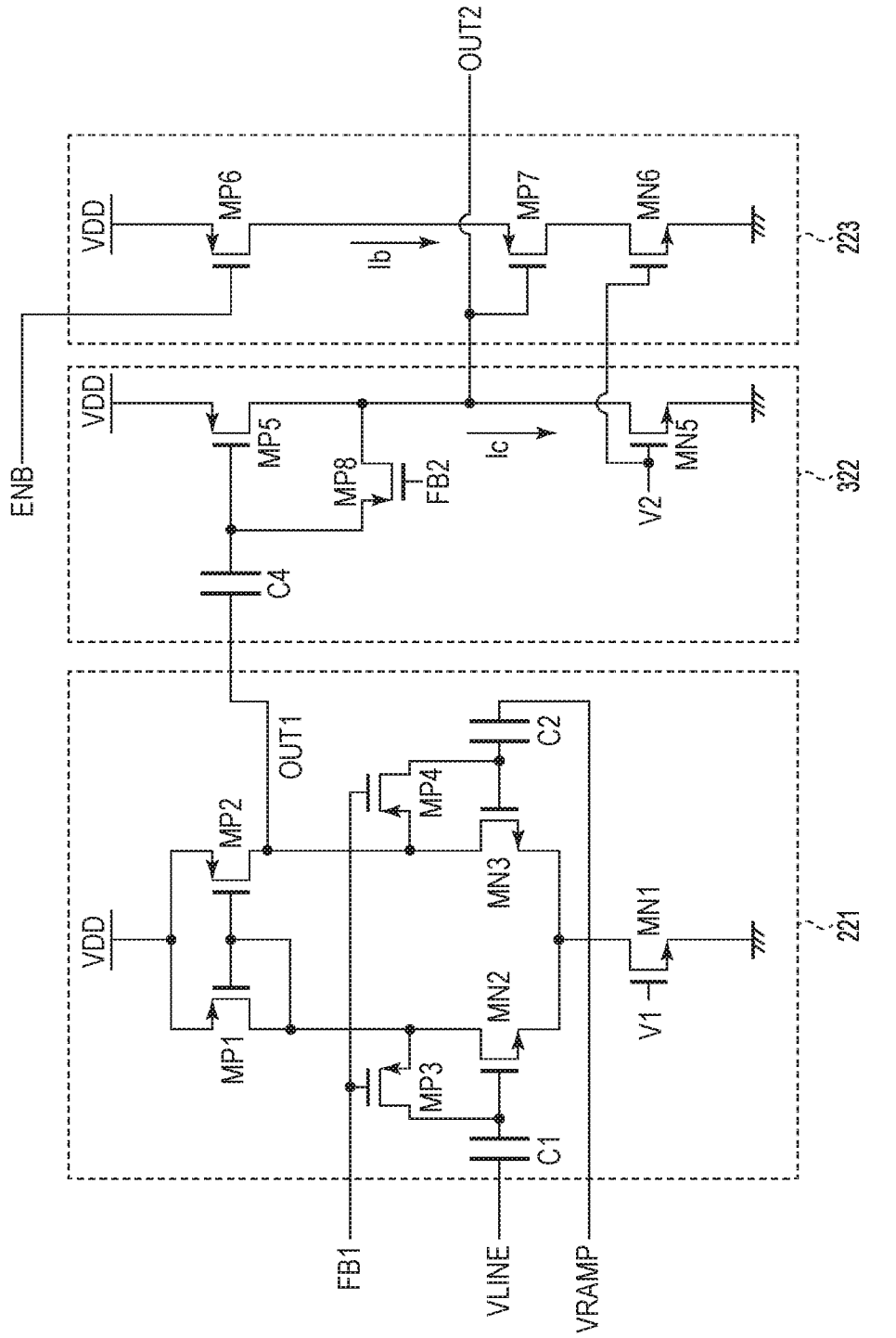
FIG. 14 is a diagram of a circuit example of a comparator of a second embodiment.

Next, an imaging device of a second embodiment will be described. FIG. 14 is a diagram of a circuit example of a comparator of the present embodiment. The comparator 320 has the differential amplifier circuit 221, the source ground circuit 322, and the current compensation circuit 223. The comparator 320 of the present embodiment is different from the comparator 220 of the first embodiment (FIG. 7) in the configuration of the source ground circuit 322. The imaging device of the present embodiment will be described below mainly for the configuration different from the first embodiment.

The source ground circuit 322 has a P-type input transistor MP5, a P-type switch transistor MP8, an N-type load transistor MN5, and a clamp capacitor C4. The gate of the input transistor MP5 is connected to the collector of the load transistor MP2 in the differential amplifier circuit 221 via the clamp capacitor C4, and the signal OUT1 is input to the gate. The source of the input transistor MP5 is connected to the power source voltage VDD, and the drain of the input transistor MP5 is connected to the drain of the load transistor MN5. The signal OUT2 inverted from the signal OUT1 is output from the drain of the input transistor MP5.

The load transistor MN5 functions as a load of the input transistor MP5, and the source of the load transistor MN5 is connected to the ground voltage. The gate of the load transistor MN5 is connected to a bias line, and the constant bias voltage V2 is applied to the gate via the bias line. The bias voltage V2 may be different from the bias voltage V1 applied to the gate of the current source transistor MN1. Further, the bias voltage V2 is also applied to the gate of the current source transistor MN6 of the current compensation circuit 223.

The switch transistor MP8 is provided between the gate and the drain of the input transistor MP5. That is, the source of the switch transistor MP8 is connected to the gate of the input transistor MP5, and the drain of the switch transistor MP8 is connected to the drain of the input transistor MP5. The clamp signal FB2 is input to the gate of the switch transistor MP8. When the clamp signal FB2 is controlled to the low level, the switch transistor MP8 is turned on, and the voltage of the gate of the input transistor MP5 is clamped at the voltage of the drain.

The operation of the imaging device of the present embodiment is different from the operation illustrated in FIG. 8 in that the polarity of the clamp signal FB2 is inverted. Since other operations are substantially the same as the operation illustrated in FIG. 8, the description thereof will be omitted. Also in the present embodiment, it is possible to efficiently arrange AD conversion units and improve image quality in an imaging device having the stack structure. Further, in an imaging device that can read out a plurality of rows in parallel, the same type of circuit components included in a plurality of AD conversion units are arranged together, and image quality can be further improved.

Third Embodiment

Figure 15:
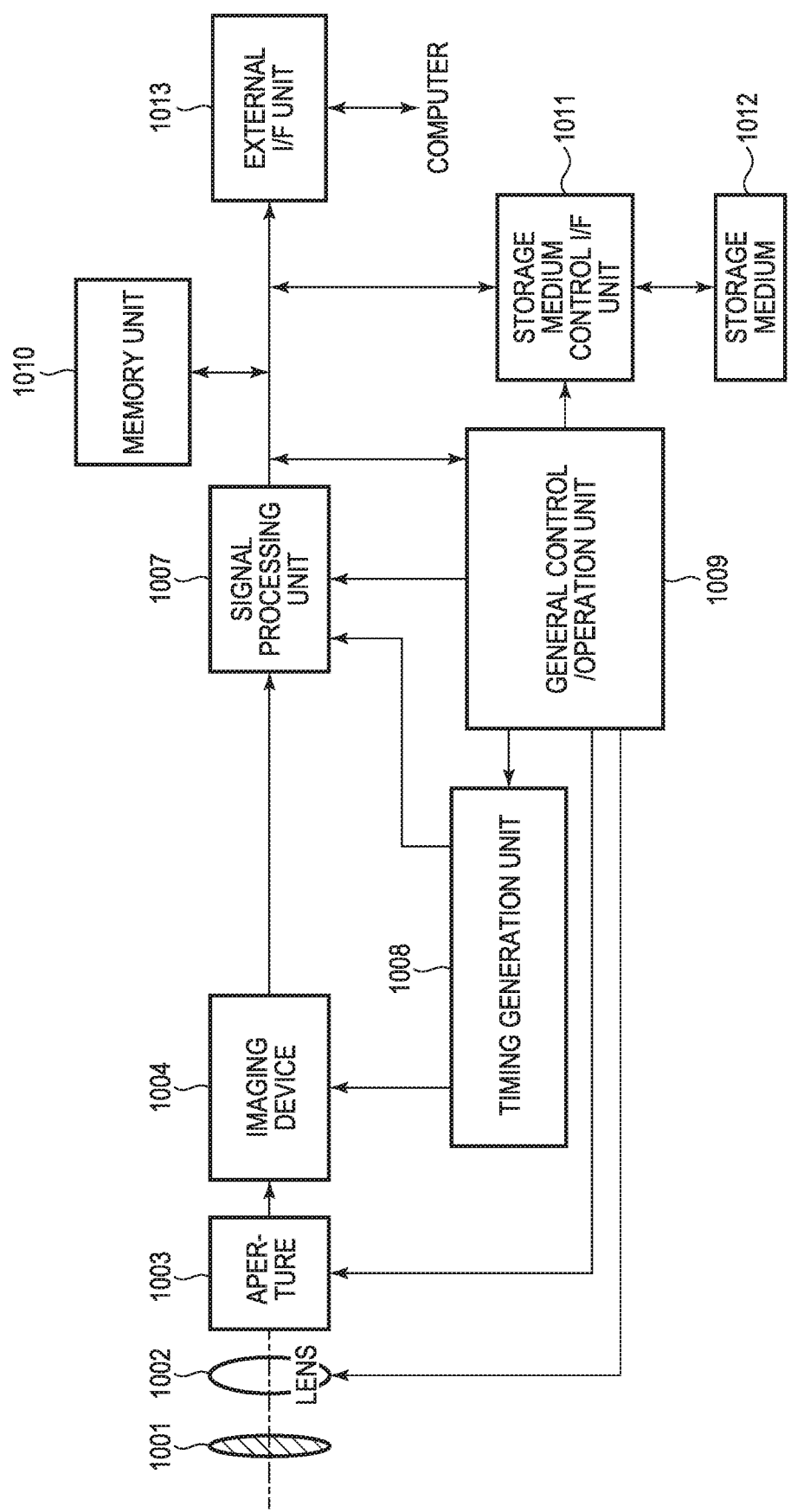
FIG. 15 is a block diagram of an imaging system of a third embodiment.

Each solid state imaging device in the embodiments described above is applicable to various imaging systems. The imaging system may be a digital still camera, a digital camcorder, a camera head, a copy machine, a fax machine, a mobile phone, an on-vehicle camera, an observation satellite, a surveillance camera, or the like. FIG. 15 illustrates block diagram of a digital still camera as an example of an imaging system.

An imaging system illustrated in FIG. 15 includes a barrier 1001, a lens 1002, an aperture 1003, an imaging device 1004, a signal processing device 1007, a timing generation unit 1008, a general control/operation unit 1009, a memory unit 1010, a storage medium control I/F unit 1011, a storage medium 1012, and an external I/F unit 1013. The barrier 1001 protects the lens 1002, and the lens 1002 captures an optical image of an object onto the imaging device 1004. The aperture 1003 changes the amount of light that has passed through the lens 1002. The imaging device 1004 includes a solid state imaging device of each of the embodiments described above and converts an optical image captured by the lens 1002 into image data. The signal processing device 1007 performs various correction or data compression on image data output from the imaging device 1004. The timing generation unit 1008 outputs various timing signals to the imaging device 1004 and the signal processing device 1007. The general control/operation unit 1009 controls the entire digital still camera, and the memory unit 1010 temporarily stores image data. The storage medium control I/F unit 1011 is an interface used for storage or readout of image data on the storage medium 1012, and the storage medium 1012 is a removable storage medium such as a semiconductor memory used for storage or readout of imaging data. The external I/F unit 1013 is an interface used for communicating with an external computer or the like. A timing signal or the like may be input from the outside of the imaging system, and the imaging system may be any imaging system having at least the imaging device 1004 and the signal processing device 1007 that processes an image signal output from the imaging device 1004.

In the present embodiment, the configuration in which the imaging device 1004 and the AD conversion unit are provided on the same semiconductor substrate has been described. However, the imaging device 1004 and the AD conversion unit may be formed on the separate semiconductor substrates. Further, the imaging device 1004 and the signal processing device 1007 may be formed on the same semiconductor substrate.

Further, each pixel may include a first photoelectric conversion unit and a second photoelectric conversion unit. The signal processing device 1007 may be configured to process a pixel signal based on charges generated by the first photoelectric conversion unit and a pixel signal based on charges generated by the second photoelectric conversion unit and acquire distance information on the distance from the imaging device 1004 to an object.

Fourth Embodiment

Figure 16A:
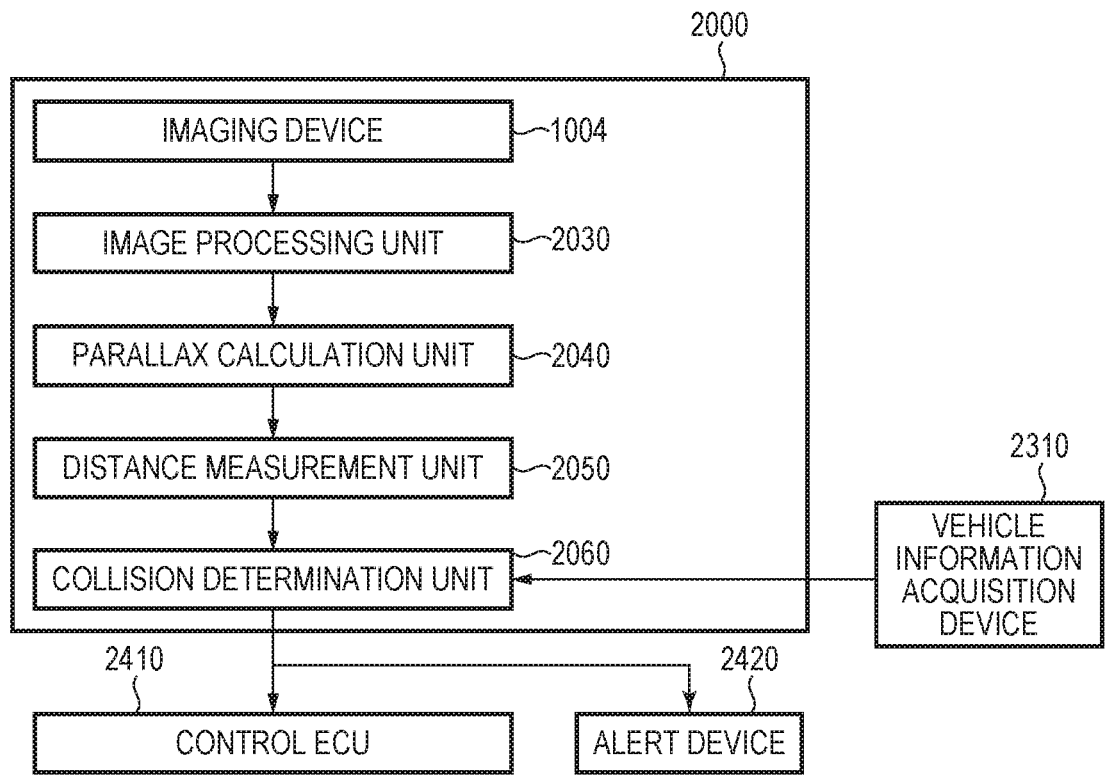
FIG. 16A and FIG. 16B are block diagrams of an imaging system of a fourth embodiment.
Figure 16B:
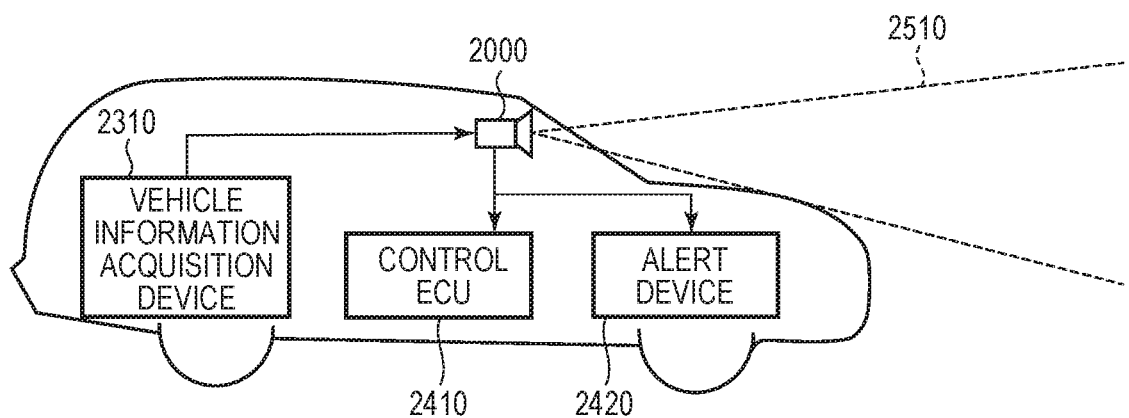

FIG. 16A and FIG. 16B illustrate one example of an imaging system related to an on-vehicle camera in a fourth embodiment of the present invention. An imaging system 2000 has an imaging device 1004 of any of the embodiments described above. The imaging system 2000 has an image processing unit 2030 that performs image processing on a plurality of image data acquired by the imaging device 1004 and a parallax calculation unit 2040 that calculates a parallax (a phase difference of parallax images) from the plurality of image data acquired by the imaging system 2000. Further, the imaging system 2000 has a distance measurement unit 2050 that calculates a distance to the object based on the calculated parallax and a collision determination unit 2060 that determines whether or not there is a collision possibility based on the calculated distance. Here, the parallax calculation unit 2040 and the distance measurement unit 2050 are an example of a distance information acquisition unit that acquires distance information on the distance to the object. That is, the distance information is information on a parallax, a defocus amount, a distance to an object, or the like. The collision determination unit 2060 may use any of the distance information to determine the collision possibility. The distance information acquisition unit may be implemented by dedicatedly designed hardware or may be implemented by a software module. Further, the distance information acquisition unit may be implemented by a field programmable gate array (FPGA) or an application specific integrated circuit (ASIC) or may be implemented by a combination thereof.

The imaging system 2000 is connected to the vehicle information acquisition device 2310 and can acquire vehicle information such as a vehicle speed, a yaw rate, a steering angle, or the like. Further, the imaging system 2000 is connected to a control ECU 2410, which is a control device that outputs a control signal for causing a vehicle to generate braking force based on a determination result by the collision determination unit 2060. Further, the imaging system 2000 is also connected to an alert device 2420 that issues an alert to the driver based on a determination result by the collision determination unit 2060. For example, when the collision probability is high as the determination result of the collision determination unit 2060, the control ECU 2410 performs vehicle control to avoid a collision or reduce damage by applying a brake, pushing back an accelerator, suppressing engine power, or the like. The alert device 2420 alerts a user by sounding an alert such as a sound, displaying alert information on a display of a car navigation system or the like, providing vibration to a seat belt or a steering wheel, or the like. The imaging system 2000 functions as a control unit that controls the operation of controlling a vehicle as described above.

In the present embodiment, an area around a vehicle, for example, a front area or a rear area is captured by using the imaging system 2000. FIG. 16B illustrates the imaging system when a front area of a vehicle (a capturing area 2510) is captured. The vehicle information acquisition device 2310 as an imaging control unit instructs the imaging system 2000 or the imaging device 1004 to perform the operation described in the above first to third embodiments. Since the operation of the imaging device 1004 is the same as that in the first to fourth embodiments, the description thereof will be omitted here. Such a configuration can further improve the ranging accuracy.

Although the example of control for avoiding a collision to another vehicle has been described above, the embodiment is applicable to automatic driving control for following another vehicle, automatic driving control for not going out of a traffic lane, or the like. Furthermore, the imaging system is not limited to the subject vehicle such as an automobile and can be applied to a moving unit (moving apparatus) such as a ship, an airplane, or an industrial robot, for example. In addition, the imaging system can be widely applied to a device which utilizes object recognition, such as an intelligent transportation system (ITS), without being limited to moving units.

Other Embodiments

The present invention is not limited to the embodiments described above, and various modifications are possible. For example, an example in which a part of the configuration of any of the embodiments is added to another embodiment or an example in which a part of the configuration of any of the embodiments is replaced with a part of the configuration of another embodiment is one of the embodiments of the present invention.

Although the configuration in which the reference signal VRAMP increases with time has been illustrated as an example in the above embodiments, a configuration in which the reference signal VRAMP decreases with time may be employed. Further, the gain of the reference signal VRAMP may be changed in accordance with the amplitude of the signal VLINE.

Although the AD conversion unit using a ramp signal whose voltage changes depending on time has been illustrated as an example in the above embodiments, the AD conversion unit may be of a successive comparison type or a parallel processing type. When the AD conversion unit is of the successive comparison type, the comparator performs comparison with a reference signal that changes from a voltage corresponding to the most significant bit (MSB) to a voltage corresponding to the least significant bit (LSB).

Note that all of the embodiments described above are mere embodied examples in implementing the present invention, and the technical scope of the present invention should not be construed in a limiting sense by these embodiments. That is, the present invention can be implemented in various forms without departing from the technical concept or the primary feature thereof.

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-107924, filed on Jun. 10, 2019, which is hereby incorporated by reference wherein in its entirety.

What is claimed is:

1. An imaging device comprising:
   a first semiconductor chip in which a plurality of pixels that generate pixel signals are formed; and
   a second semiconductor chip stacked on the first semiconductor chip and including a plurality of analog-to-digital conversion units that convert analog signals output from the pixels into digital signals,
   wherein the plurality of analog-to-digital conversion units include comparators, respectively, and each of the comparators compares each of the analog signals with a reference signal, and
   wherein each of the comparators includes:
     a differential amplifier circuit including an output node that outputs a first signal based on a difference between each of the analog signals and the reference signal,
     a source ground circuit that includes an input transistor including a gate configured to receive the first signal from the output node of the differential amplifier circuit and a load transistor cascade-connected to the input transistor and outputs a second signal from a connection node of the input transistor and the load transistor, and
     a current compensation circuit that includes a current control transistor including a gate configured to receive the second signal from the connection node and a current source transistor cascade-connected to the current control transistor and causes a second current to flow that changes complementarily with respect to a change of a first current flowing in the source ground circuit,
   wherein the imaging device further comprises a first signal line and a second signal line connected to a corresponding group of pixels arranged on one column of the plurality of pixels,
   wherein the plurality of analog-to-digital conversion units include a first analog-to-digital conversion unit arranged in association with the first signal line and a second analog-to-digital conversion unit arranged in association with the second signal line, and
   wherein a first circuit component forming the first analog-to-digital conversion unit and a second circuit component of the same function as a function of the first circuit component and forming the second analog-to-digital conversion unit are aligned adjacent to each other along a direction of one column forming the group of pixels in a continuous region of the second semiconductor chip.

2. The imaging device according to claim 1,
   wherein the current compensation circuit further includes an enable switch transistor connected between a first power source line and the current control transistor,
   wherein a source of the current source transistor of the current compensation circuit is connected to a second power source line, and
   wherein in the source ground circuit, a source of the input transistor is connected to the first power source line, and a source of the load transistor is connected to the second power source line.

3. The imaging device according to claim 1 further comprising:
   a plurality of signal lines arranged to a group of pixels arranged on one column of the plurality of pixels, and
   a group of load current sources connected to the plurality of signal lines, respectively, and arranged adjacent to each other in the second semiconductor chip,
   wherein the plurality of analog-to-digital conversion units are arranged in association with the plurality of signal lines,
   wherein a plurality of the comparators include a group of comparators arranged adjacent to each other,
   wherein the group of comparators are aligned along a direction of the one column forming the group of pixels, wherein the group of load current sources are aligned along a direction of the one column forming the group of pixels, and wherein the group of comparators and the group of load current sources are aligned along a direction of the one column forming the group of pixels.

4. The imaging device according to claim 2, wherein the second semiconductor chip includes a first load current source connected to the first signal line and a second load current source connected to the second signal line, and wherein the first load current source and the second load current source are aligned adjacent to each other along a direction of one column forming the group of pixels in a continuous first region of the second semiconductor chip.

5. The imaging device according to claim 4, wherein the first circuit component and the second circuit component are aligned adjacent to each other along a direction of one column forming the group of pixels in a continuous second region that is different from the first region.

6. The imaging device according to claim 5, wherein the first region and the second region are aligned along a direction of one column forming the group of pixels.

7. The imaging device according to claim 5, wherein each of the first signal line and the second signal line in the first semiconductor chip is connected to the signal line of the second semiconductor chip via a junction portion, and wherein the junction portion is arranged so as to overlap at least a part of the first region or the second region in plan view.

8. The imaging device according to claim 5, wherein the first analog-to-digital conversion unit includes a first memory that holds a count signal at a timing when the second signal of the first analog-to-digital conversion unit is inverted, wherein the second analog-to-digital conversion unit includes a second memory that holds a count signal at a timing when the second signal of the second analog-to-digital conversion unit is inverted, and wherein the first memory and the second memory are aligned adjacent to each other along a direction of the one column forming the group of pixels in a continuous third region that is different from the first region and the second region.

9. The imaging device according to claim 8, wherein the first region, the second region, and the third region are aligned adjacent to each other along a direction of one column forming the group of pixels.

10. The imaging device according to claim 9, wherein the second region is arranged between the first region and the third region in plan view.

11. The imaging device according to claim 10, wherein the second semiconductor chip includes a signal processing circuit that reads out signals from the first memory and the second memory, and wherein the third region is arranged between the second region and the signal processing circuit in plan view.

12. The imaging device according to claim 5, wherein the second region includes a plurality of sub-regions that are continuous along a direction of one column forming the group of pixels, and wherein a first comparator component forming the comparator of the first analog-to-digital conversion unit and a second comparator component of the same function as a function of the first comparator component and forming the comparator of the second analog-to-digital conversion unit are aligned adjacent to each other along a direction of one column forming the group of pixel in the same sub-region.

13. The imaging device according to claim 5, wherein the first circuit component includes a first comparator forming the first analog-to-digital conversion unit, and wherein the second circuit component includes a second comparator forming the second analog-to-digital conversion unit.

14. The imaging device according to claim 5, wherein the first circuit component includes a first pair of differential transistors forming the differential amplifier circuit of the first analog-to-digital conversion unit, wherein the second circuit component includes a second pair of differential transistors forming the differential amplifier circuit of the second analog-to-digital conversion unit, and wherein the first pair of differential transistors and the second pair of differential transistors are aligned adjacent to each other along a direction of one column forming the group of pixels.

15. The imaging device according to claim 14, wherein the first pair of differential transistors are aligned in a direction intersecting a direction of one column forming the group of pixels, and the second pair of differential transistors are aligned in a direction intersecting a direction of one column forming the group of pixels.

16. The imaging device according to claim 5, wherein the first circuit component includes a first pair of current mirror transistors forming the differential amplifier circuit of the first analog-to-digital conversion unit, wherein the second circuit component includes a second pair of current mirror transistors forming the differential amplifier circuit of the second analog-to-digital conversion unit, and wherein the first pair of current mirror transistors and the second pair of current mirror transistors are aligned adjacent to each other along a direction of one column forming the group of pixels.

17. The imaging device according to claim 16, wherein the first pair of current mirror transistors are aligned in a direction intersecting a direction of one column forming the group of pixels, and the second pair of current mirror transistors are aligned in a direction intersecting a direction of one column forming the group of pixels.

18. The imaging device according to claim 5, wherein the first circuit component includes a first constant current source transistor forming the differential amplifier circuit of the first analog-to-digital conversion unit, wherein the second circuit component includes a second constant current source transistor forming the differential amplifier circuit of the second analog-to-digital conversion unit, and wherein the first constant current source transistor and the second constant current source transistor are aligned adjacent to each other along a direction of one column forming the group of pixels.

19. The imaging device according to claim 5, wherein the first circuit component corresponds to a first group of elements including the input transistor and the enable switch transistor of the first analog-to-digital conversion unit, wherein the second circuit component is a second group of elements including the input transistor and the enable switch transistor of the second analog-to-digital conversion unit, and
wherein the first group of elements and the second group of elements are aligned adjacent to each other along a direction of one column forming the group of pixels.

20. The imaging device according to claim 19, wherein in each of the first group of elements and the second group of elements, the input transistor and the enable switch transistor are aligned in a direction intersecting a direction of one column forming the group of pixels.

21. The imaging device according to claim 5,
wherein the first circuit component is a third group of elements including the load transistor and the current source transistor of the first analog-to-digital conversion unit,
wherein the second circuit component is a fourth group of elements including the load transistor and the current source transistor of the second analog-to-digital conversion unit, and
wherein the third group of elements and the fourth group of elements are aligned adjacent to each other along a direction of one column forming the group of pixels.

22. The imaging device according to claim 21, wherein in the third group of elements and the fourth group of elements, the load transistor and the current source transistor are aligned in a direction intersecting a direction of one column forming the group of pixels.

23. The imaging device according to claim 21, wherein two transistors forming any of the pair of or the first to fourth groups of elements share a source region.

24. The imaging device according to claim 21, wherein two transistors forming any of the pair of or the first to fourth groups of elements are formed in the same well region.

25. The imaging device according to claim 21,
wherein the third group of elements further includes a first holding capacitor including one electrode connected to a gate of the load transistor and the other electrode connected to the second power source line in the first analog-to-digital conversion unit, and
wherein the fourth group of elements further includes a second holding capacitor including one electrode connected to a gate of the load transistor and the other electrode connected to the second power source line in the second analog-to-digital conversion unit.

26. The imaging device according to claim 1,
wherein the first circuit component includes the current control transistor forming the current compensation circuit of the first analog-to-digital conversion unit,
wherein the second circuit component includes the current control transistor forming the current compensation circuit of the second analog-to-digital conversion unit, and
wherein the current control transistor of the first analog-to-digital conversion unit and the current control transistor of the second analog-to-digital conversion unit are aligned adjacent to each other along a direction of one column forming the group of pixels.

27. The imaging device according to claim 1 further comprising:
a clamp capacitor provided between the output node of the differential amplifier circuit and a gate of the input transistor; and
a switch transistor provided between the gate and a drain of the input transistor.

28. The imaging device according to claim 1, wherein a gate of the current source transistor is connected to a gate of the load transistor.

29. An imaging system comprising:
the imaging device according to claim 1; and
a signal processing device that processes a plurality of the pixel signals and acquires distance information on a distance from the imaging device to an object.

30. A moving unit comprising:
the imaging system according to claim 29; and
a control unit that controls the moving unit based on at least one of the pixel signal and the distance information acquired by the imaging system.

31. A semiconductor chip to be stacked comprising:
a connection portion used for connecting to another semiconductor chip in which a plurality of pixels each including a photoelectric conversion unit are formed; and
analog-to-digital conversion units that convert analog signals output from the pixels via signal lines into digital signals,
wherein each of the analog-to-digital conversion units includes a comparator that compares each of the analog signals with a reference signal,
wherein the comparator includes:
a differential amplifier circuit including an output node that outputs a first signal based on a difference between each of the analog signals and the reference signal,
a source ground circuit that includes an input transistor including a gate configured to receive the first signal from the output node of the differential amplifier circuit and a load transistor cascade-connected to the input transistor and outputs a second signal from a connection node of the input transistor and the load transistor, and
a current compensation circuit that includes a current control transistor including a gate configured to receive the second signal from the connection node and a current source transistor cascade-connected to the current control transistor, wherein the current control transistor causes a second current to flow that changes complementarily with respect to a change of a first current flowing in the source ground circuit,
wherein the imaging device further comprises a first signal line and a second signal line connected to a corresponding group of pixels arranged on one column of the plurality of pixels,
wherein the plurality of analog-to-digital conversion units include a first analog-to-digital conversion unit arranged in association with the first signal line and a second analog-to-digital conversion unit arranged in association with the second signal line, and
wherein a first circuit component forming the first analog-to-digital conversion unit and a second circuit component of the same function as a function of the first circuit component and forming the second analog-to-digital conversion unit are aligned adjacent to each other along a direction of one column forming the group of pixels in a continuous region of the second semiconductor chip.

* * * * *